(12) United States Patent
Marioni

(10) Patent No.: US 7,218,067 B2
(45) Date of Patent: May 15, 2007

(54) MAGNETIC ACTUATOR DRIVE FOR ACTUATION AND RESETTING OF MAGNETIC ACTUATION MATERIALS

(75) Inventor: Miguel A. Marioni, Zurich (CH)

(73) Assignee: Massachusetts Institute of Technology, Cambridge, MA (US)

( * ) Notice: Subject to any disclaimer, the term of this patent is extended or adjusted under 35 U.S.C. 154(b) by 136 days.

(21) Appl. No.: 11/098,753

(22) Filed: Apr. 4, 2005

(65) Prior Publication Data

US 2005/0237139 A1    Oct. 27, 2005

Related U.S. Application Data

(60) Provisional application No. 60/559,702, filed on Apr. 5, 2004.

(51) Int. Cl.
  *H02N 2/00*   (2006.01)
  *H01L 41/12*   (2006.01)
(52) U.S. Cl. .......................................... 318/118; 310/26
(58) Field of Classification Search .................. 310/26; 318/118
  See application file for complete search history.

(56) References Cited

U.S. PATENT DOCUMENTS 2,876,419 A * 3/1959 Gianola et al. ............. 332/173
3,470,402 A * 9/1969 Abbott ........................ 310/26
3,634,742 A * 1/1972 Edson ........................ 318/118
3,903,739 A * 9/1975 Kolavcic .................. 73/862.69
4,743,789 A * 5/1988 Puskas .................... 310/316.01
5,958,154 A    9/1999 O'Handley et al.
6,157,101 A    12/2000 Ullakko

FOREIGN PATENT DOCUMENTS

WO    WO 98/21763    5/1998
WO    WO 99/45631    9/1999

OTHER PUBLICATIONS

Janos, "Smart Materials and Structers: Technological Feasibility and Policy Assessment," M.S. Thesis, MIT, Cambridge, MA, Jun. 2000.
Marioni, "Pulsed Magnetic Field-Induced Twin Boundary Motion in Ni-Mn-Ga," Ph.D. Thesis, MIT, Cambridge, MA, May 2003.
Marioni et al., "Ferromagnetic Shape Memory Alloy Ni-mn-Ga," Slide Presentation, IBM, Almaden, CA, Apr. 2001.

(Continued)

*Primary Examiner*—Burton Mullins
(74) *Attorney, Agent, or Firm*—Theresa A. Lober

(57) ABSTRACT

A magnetic actuator is provided including a magnetic field-actuated material and a plurality of interconnected electrically conducting coils, each coil including a number of wire turns arranged relative to at least one other coil to produce at the magnetic field-actuated material, by superposition, a magnetic field that is substantially oriented in one of a plurality of selectable discrete directions. An actuator drive circuit is connected to the coils in a circuit configuration that reverses a direction of electrical current flow through at least one of the coils to reorient the magnetic field from a first selected direction to a second selected direction of the plurality of selectable discrete directions.

65 Claims, 12 Drawing Sheets

OTHER PUBLICATIONS

O'Handley et al., "6% magnetic-field-induced strain in the ferromagnetic shape-memory alloy Ni-Mn-Ga," UCSD presentation, Mar. 2001.

Marioni et al., "Pulsed Magnetic Field Actuation of Ni-Mn-Ga," Presentation at "Active Materials - Behavior and Mechanics," SPIE conference, San Diego, CA, Mar. 2002.

Marioni et al., "Pulsed Field Actuation of Ni-Mn-Ga Ferromagnetic Shape Memory Alloy Single Crystal," Presentation at International Conference on Martensitic Transoformations - ICOMAT, Helsinki, Jun. 2002.

Marioni et al., "Ni-Mn-Ga Ferromagnetic Shape Memory Alloy," Michelin Corp. Presentation, MIT Industrial Liason Program, Jul. 2002.

O'Handley et al., "Ferromagnetic shape memory alloys: Where might they be useful?," Presentation at INTERMAG, Boston, Apr. 2003.

Feuchtwanger et al., "Pulsed Magnetic-Field Actuation of Ni-Mn-Ga Ferromagentic Shape-Memory Crystals," ICM 2003, Rome, Italy, Jul. 2003.

O'Handley et al., "Twin-boundary kinetics in Ni-Mn-Ga crystals," MMM conference Anaheim, CA, Jan. 2004.

Marioni et al., "Magnetic Shape-Memory Alloys and their applications," Presentation at EMPA, Zurich, Switzerland, Jan. 2004.

Marioni, "X-actuator," Presentation at Idea Stream Symposium 2004, MIT Deshpande Center, Cambridge, MA, Apr. 8, 2004.

Kokorin et al., "Phase Transistions in Alloys Ni2MnGaxIn1-x," Phys. Met. Metall., V. 67, No. 3, pp. 173-176, 1989.

Korkorin et al., "Sequential formation of martensite phases during uniaxial loading of single crystals of alloy Ni2MnGa," Fiz. metal. metalloved., N. 9, pp. 106-113, 1991.

Cederstrom et al., "Relationship Between Shape Memory Material Properties and Applications," Jnl. De Physique IV, Colloque C2, supplemant au Jnl de Physique III, V. 5, pp. C2-335-341, 1995.

Webster et al., "Magnetic order and phase transfromation in Ni2MnGa," Philosophical Magazine B. V. 49, N. 3, pp. 295-310, 1984.

Martynov et al., "The crystal structure of thermally- and stress-induced Martensites in Ni2MnGa single crystals," J. Phys. III France, V. 2, pp. 739-749, May 1992.

Chernenko et al., "The development of new ferromagnetic shape memory alloys in Ni-Mn-Ga System," Scripta Metalurg., 33:1239-1244, 1995.

Ullakko et al., New developments in actuator materials as reflected in magnetically controlled shape memory alloys and high-strength sape memory steels,"Proc." Smart Structures and Materials, San Diego, CA, SPIE, V. 2715, pp. 42-50, 1996.

Fritsch et al., "Martensitic transformation in Ni-Mn-Ga alloys," Phase Trans., 57:233-240, 1996.

Ullakko, "Magnetically driven shape memory materials," Abstract from Int. Conf. on Displacive Phase Transformations and their applications in Mat. Eng. Tech. Prog. Urbana, IL, May 1996.

Ullakko, "Large-stroke and high-strength actuator materials for adaptive structures," Proc., Third Int. Conf. on Intelligent Mat./ECSSM, Lyon, France, SPIE V. 2779, pp. 5050-510, 1996.

Ullakko et al., "Large magnetic-field-induced strains in Ni2MnGa single crystals," Appl. Phys. Lett., Vo. 69, N. 13, pp. 1966-1968m Sep. 1996.

Tickle et al., "Ferromagnetic Shape Memory in the NiMnGa System," IEEE Trans. on Magnetics, V. 35, Issue 5, Part 3, pp. 4301-4310, Sep. 1999.

Chernenko et al, "Sequence of martensitic transformations in Ni-Mn-Ga alloys," Phys. Rev. B, V. 57, N. 5, pp. 2659-2662, Feb. 1998.

O'Handley, "Model for strain and magnetization in magnetic shape-memory alloys," Jnl. of Applied Phys., V. 83, N. 6, pp. 3263-3269, Mar. 1998.

Murray et al., "Field-induced strain under load in Ni-Mn-Ga magnetic shape memory materials," Jnl. of Applied Phys., V. 83, N. 11, pp. 1-3, Jun. 1998.

Murray et al., "6% magnetic-field-induced strain by twin-boundary motion in ferromagnetic Ni-Mn-Ga," Appl. Phys. Lett., V. 77, N. 6, pp. 886-888, Aug. 2000.

Henry et al., "AC performance and modeling of ferromagnetic shape memory acluators," Smart Structures and Materials 2001: Active Materials: Behavior and Mechanics, Proc. SPIE V. 4333, pp. 151-162, 2001.

Henry et al., "Dynamic Magnetic Field-Induced STrain Response of Ni49.8Mn28.5Ga21.7 Ferromagnetic Shape Memory Alloy up to 332 Hz," The Fourth Pacific Rim Int. Conf. on Adv. Mat. and Proc (PRICM4), The Japan Inst. of Metals, 2001.

Marioni et al., "Pulsed magnetic field actuation of single-crystalline ferromagnetic shape memory alloy Ni-Mn-Ga," Smart Structers and Mats. 2002: Active Materials: Behavior and Mechanics, SPIE V. 4699, pp. 191-194, 2002.

Marioni et al., "Pulsed Field actuation of Ni-Mn-Ga ferromagnetic shape memory alloy single crystal," J. Phys. IV France, V. 112, pp. 1001-1002, 2003.

Sozinov et al., "Giant magnetic-field-induced strain in NiMnGa seven-layered martensitic phase," Appl. Phys. Lett. V. 80, N. 10, pp. 1746-1748, Mar. 2002.

Tellinen et al., "Basic properties of magnetic shape memory actuators," 8th international conference ACTUATOR 2002, Bremen, Germany, Jun. 2002.

Marioni et al., "Pulsed magnetic field-induced actuation of Ni-Mn-Ga single crystals," Appl. Phys. Lett., V. 83, N. 19, pp. 3966-3968, Nov. 2003.

Marioni et al., "Non-Uniform Twin-Boundary Motion In Ni-Mn-Ga Single Crystals," Appl. Phys. Lett., V. 84, pp. 4071-4073, 2004.

Ullakko et al., "Magnetically controlled shape memory effect in Ni2MnGa intermetallics," scripta Materiala, V. 36, N. 10, pp. 1133-1138, May 1997.

Wuttig et al., "Occurrence of ferromagnetic shape memory alloys," Jnl. Appl. Phys., V. 87, N. 9, pp. 4707-4711, May 1, 2000.

Wuttig et al., "A New Ferromagnetic Shape Memory Alloy System," Scripta mater. V. 44, pp. 2393-2397, 2001.

Marioni et al., The ferromagnetic shape-memory effect in Ni-Mn-Ga, Jnl. of Magnetism and Magnetic Materials, V. 290-291, pp. 35-41, 2005.

* cited by examiner

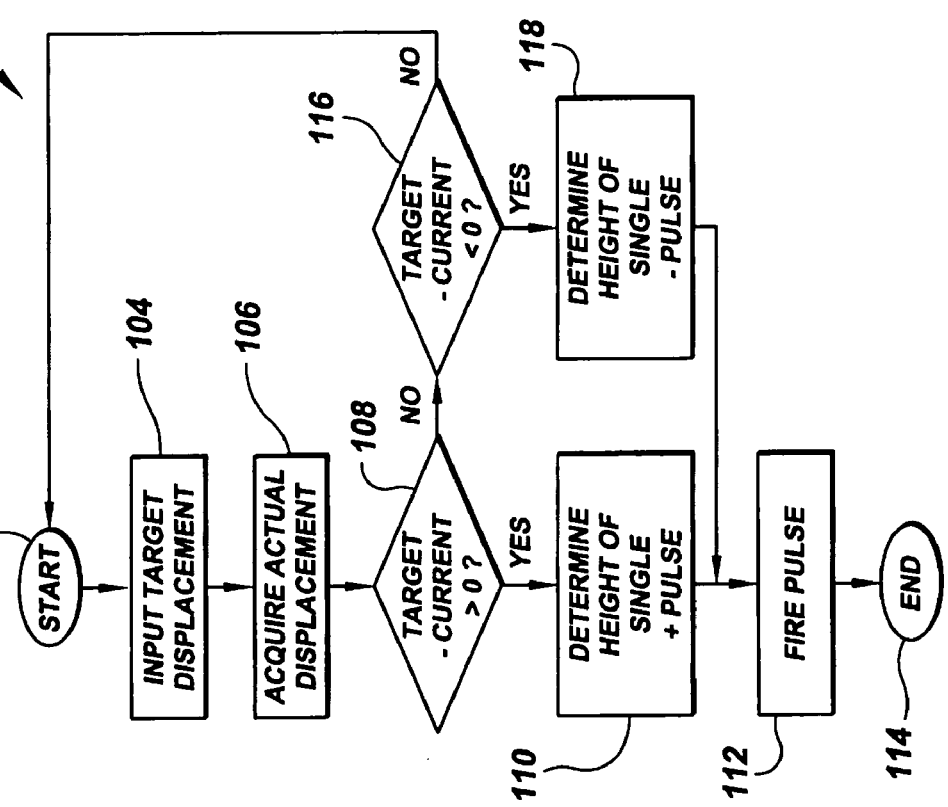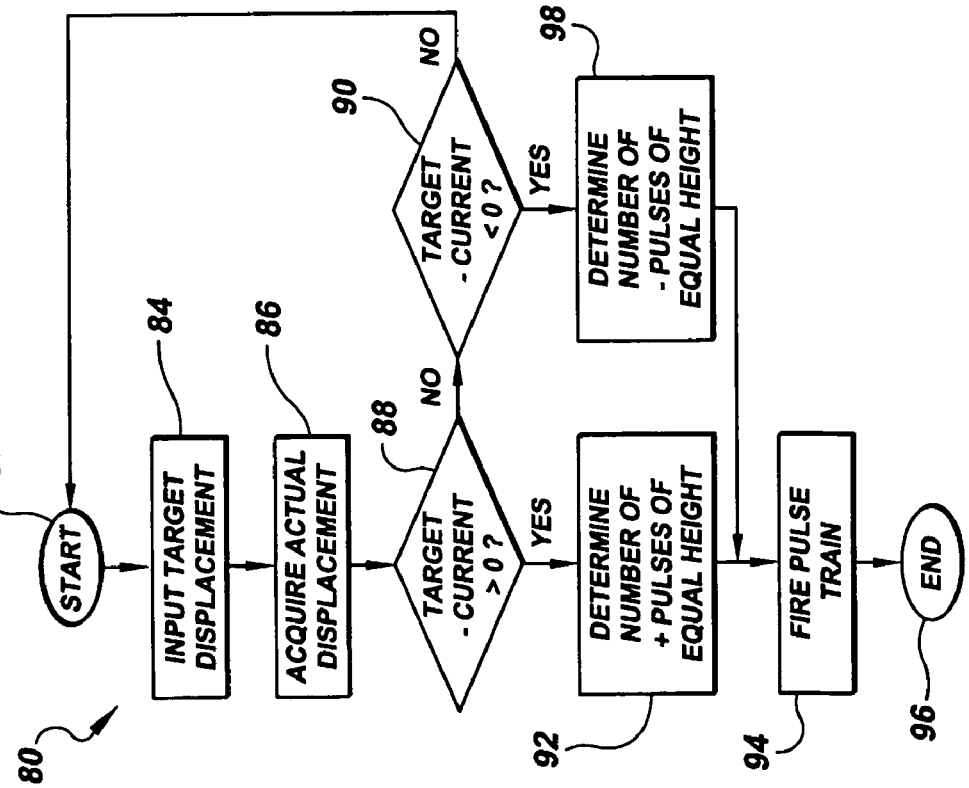

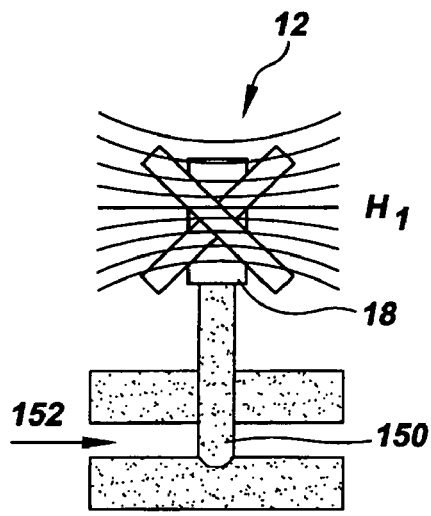
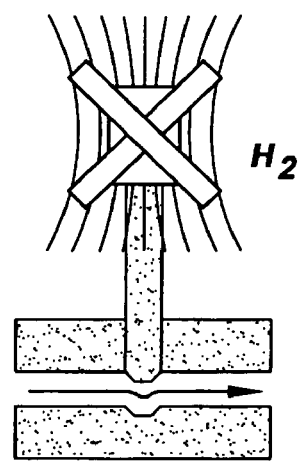
FIG.11A  FIG.11B
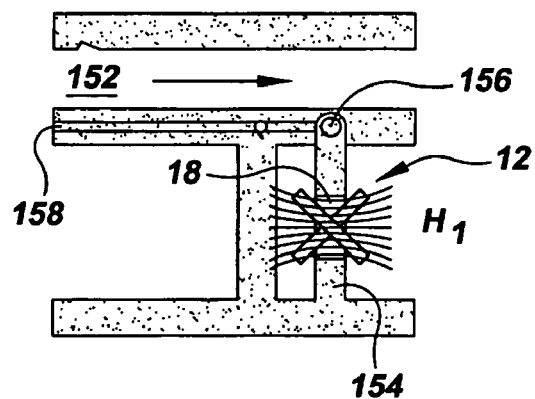
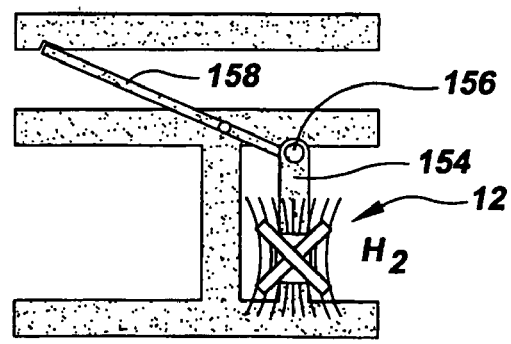
FIG.12A  FIG.12B

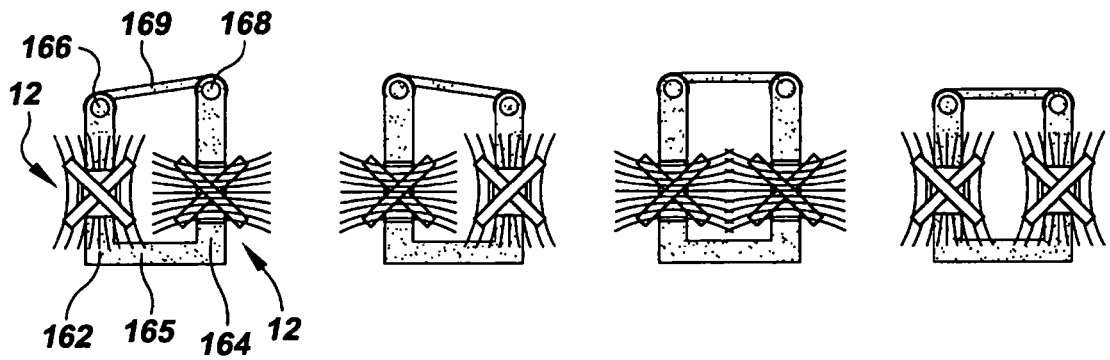
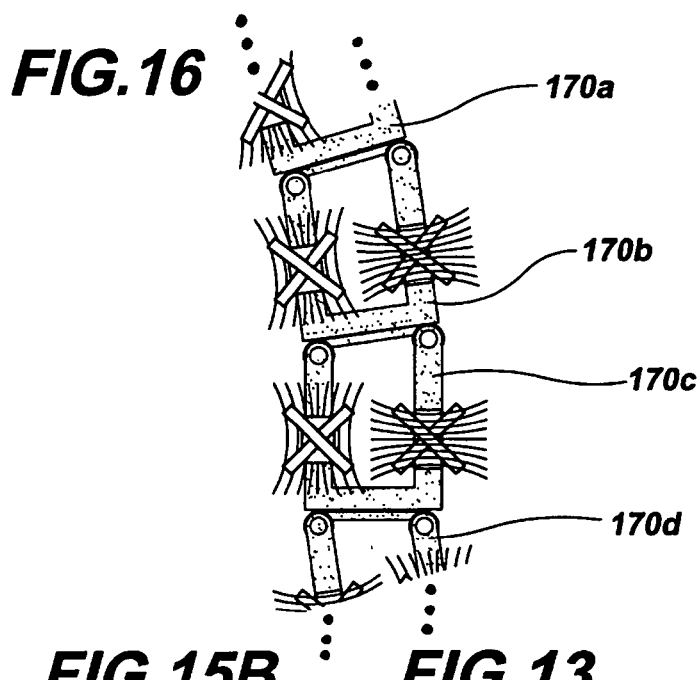
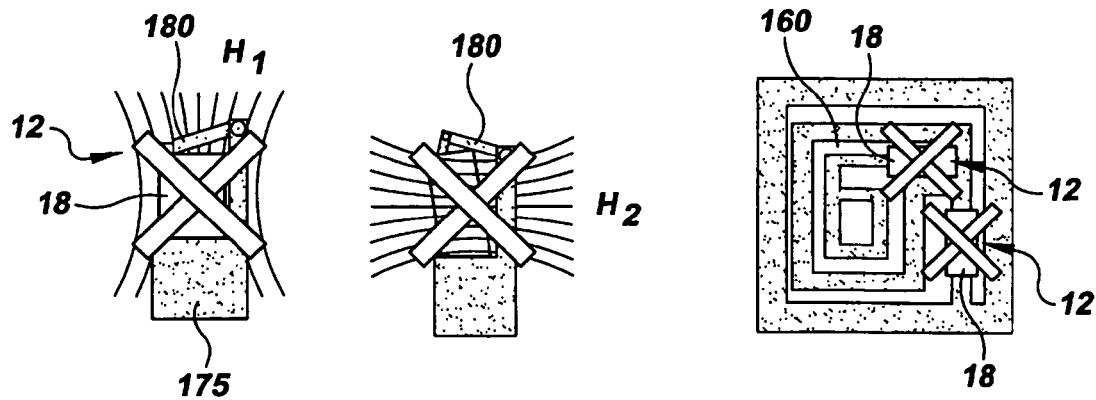

MAGNETIC ACTUATOR DRIVE FOR ACTUATION AND RESETTING OF MAGNETIC ACTUATION MATERIALS

This application claims the benefit of U.S. Provisional Application No. 60/559,702, filed Apr. 5, 2004, the entirety of which is hereby incorporated by reference.

STATEMENT REGARDING FEDERALLY SPONSORED RESEARCH

This invention was made with Government support under Contract No. N00014-01-1-0758, awarded by the Office of Naval Research. The Government has certain rights in the invention.

BACKGROUND OF THE INVENTION

This invention relates to magnetic actuators, and more particularly relates to methods for generating actuation with magnetic field-actuated materials.

Magnetic actuation is an increasingly important actuation technique for a wide range of applications. There have been identified and developed a number of magnetic materials that produce large actuation strain, as well as appreciable actuation force, with rapid actuation frequency. Such attributes address common requirements of many modern applications for which hydraulic, pneumatic, electrostatic or electro-active actuation is found to be inadequate.

The term "magnetic actuator" herein refers to a device that is capable of producing an output strain, i.e., actuation strain, in response to an appropriate magnetic driving force, by means of a magnetic field-actuated material. As such, a magnetic actuator includes a magnetic drive mechanism that produces the magnetic driving force, and an active magnetic material that transduces magnetic driving energy into output mechanical work, i.e. force and displacement. Examples of active magnetic materials include magnetostrictive materials and ferromagnetic shape memory alloy (FSMA) materials.

Application of a magnetic field to a magnetostrictive material causes the material to be strained as the magnetization vectors of the material rotate to align with the direction of the applied magnetic field. The unit cells of the material are strained by this magnetization rotation but their orientation is not changed; this results in production of an output strain. The forces developed by magnetostrictive materials can be considerably higher than those of conventional piezoelectric materials, and the energy densities supported by such magnetostrictive materials can be much larger than that of conventional hydraulic actuation systems.

Application of a stress or a magnetic field of appropriate orientation and intensity to a FSMA material in the martensitic phase causes shears in the constituent crystal or crystallites at the level of the structure's unit cells. The crystal and its sheared counterpart are twin-variants of the same structure, and have definite and differently-oriented directions of easy magnetization and spatial orientation. Twin variants can coexist in the FSMA. Their relative volume fractions are the result of the magnetic and stress-fields applied. Thus a first twin variant grows at the expense of a second when the easy axis of the first variant is better aligned with the applied magnetic field and/or its short crystallographic axis is better aligned with an applied compressive, i.e., deviatoric stress. This twin variant growth results, on a macroscopic scale, in a shape change of the FSMA material, leading to an actuation stroke. FSMA materials are generally characterized as enabling a large actuation stroke at a high speed and with a relatively high strain.

For many applications, once a magnetic actuation material is actuated by an applied magnetic field to, e.g., generate an output force or advance an actuation stroke, the material is then to be reset to a starting condition for a subsequent actuation cycle. In general, the reset process and reset conditions are specific to each magnetic actuation material. For example, magnetostrictive materials can be reset by removal of an applied magnetic field, allowing rotated domain magnetization vectors to reorient back to their original, non-actuated, orientation. This results in release of the developed actuation strain. A subsequent magnetostrictive actuation cycle can then be initiated for redevelopment of actuation strain. During the reset phase of the cycle, the magnetostrictive material can be compressed to enhance the subsequent actuation response.

FSMA materials can be reset by removal of the actuation field and application of a magnetic field in a direction that causes turning of the twin variant magnetization vectors back toward their original orientation. This reverses the magnetic field-induced extension stroke of the material caused by preferential twin variant growth. Alternately, an FSMA actuator material can be reset by mechanically forcing the material back to its original shape in the absence of the actuation field.

As evidenced by these examples, whatever magnetic material is employed in a magnetic actuator, in general some material reset mechanism is required to enable multiple reciprocating actuation cycles. Conventionally, this has required the inclusion of multiple bulky magnets or mechanical elements located at separate positions either in proximity to an actuation material or at locations to which the material is physically moved. The resulting magnetic actuation systems, tending to be large, weighty and cumbersome, cannot meet the needs of many important actuation applications.

SUMMARY OF THE INVENTION

The invention overcomes the limitations of conventional magnetic actuation systems to provide a magnetic actuator that can be implemented as a small, light-weight, and compact actuator, requiring only a comparatively small power source. These characteristics greatly expand the range of applications of magnetic material actuation.

The magnetic actuator of the invention includes a magnetic field-actuated material. A plurality of interconnected electrically conducting coils are provided, with each coil including a number of wire turns arranged relative to at least one other coil to produce at the magnetic field-actuated material, by superposition, a magnetic field that is substantially oriented in one of a plurality of selectable discrete directions. An actuator drive circuit is connected to the coils in a circuit configuration that reverses a direction of electrical current flow through at least one of the coils to reorient the magnetic field from a first selected direction to a second selected direction of the plurality of selectable discrete directions.

This actuator configuration enables a method for controlling a magnetic field-actuated material in which an electrical current flow is provided to a plurality of interconnected electrically conducting coils, with each coil including a number of wire turns arranged relative to at least one other coil to produce, by superposition, at the magnetic field-actuated material, a magnetic field that is substantially oriented in one of a plurality of selectable discrete directions. The direction of electrical current flow is reversed through at least one of the coils to reorient the magnetic field from a first selected direction to a second selected direction of the plurality of selectable discrete directions.

The magnetic actuator and actuation techniques provided by the invention can be applied to a wide range of configurations and materials, including, e.g., ferromagnetic shape memory materials and magnetostrictive materials. Additionally, DC, AC, pulsed, or other current flow control can be employed for generating a magnetic field with the coil configuration. This enables a high degree of control for actuating and resetting magnetic materials in an actuation cycle.

The magnetic actuator of the invention and its active, reciprocal actuation and reset techniques overcome the many limitations of conventional passive, stress-induced reset and passive magnetic reset techniques and address a wide range of applications, particularly those requiring compact form factor and low power consumption. Other features and advantages of the invention will be apparent from the following description and accompanying figures, and from the claims.

BRIEF DESCRIPTION OF THE DRAWINGS

FIG. 9A is a flow chart of the steps in a first technique of the invention for step-wise open-loop control of pulsed magnetic actuation and reset of a magnetic material;

FIG. 9B is a flow chart of the steps in a second technique of the invention for step-wise open-loop control of pulsed magnetic actuation and reset of a magnetic material;

FIGS. 11A–11B are schematic views of the magnetic actuator of the invention configured in a first valve arrangement, in a valve-closed condition and a valve-closed condition, respectively;

FIGS. 12A–12B are schematic views of the magnetic actuator of the invention configured in a second valve arrangement, in a valve-open condition and a valve-open condition, respectively;

FIG. 13 is a schematic view of the magnetic actuator of the invention configured as a platform positioner;

FIGS. 14A–14D are schematic views of the magnetic actuator of the invention configured as a platform tilt and displacement actuator, showing a first tilt position, a second tilt position, an extension position, and a retraction position, respectively;

FIGS. 15A–B are schematic views of the magnetic actuator of the invention configured as a platform tilt actuator, showing a retracted position and an extended position, respectively;

FIG. 16 is a schematic view of a linkage of tilt and displacement actuators like that of FIGS. 14A–D;

DETAILED DESCRIPTION OF THE INVENTION

Figure 1:
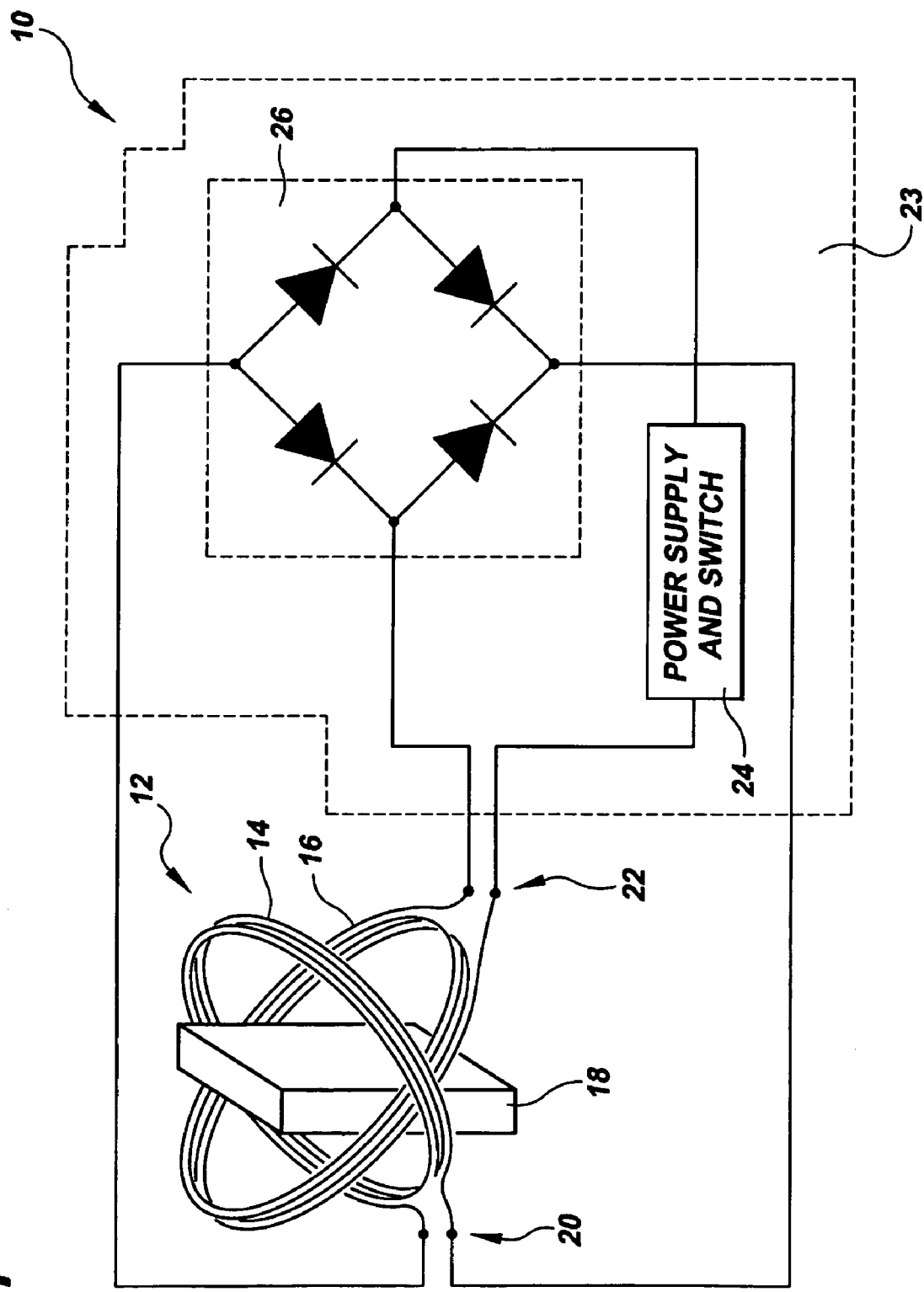
FIG. 1 is a schematic view of one example implementation of the magnetic actuator of the invention.

Referring to FIG. 1, there is shown a schematic view of an example embodiment 10 of the magnetic actuator of the invention. The actuator 10 includes a magnetic actuator drive 12 having a plurality of electrically conducting coils. The example actuator of FIG. 1 includes two coils 14, 16, each with a selected number of wire turns, but any suitable number of coils can be employed. The plurality of coils are interconnected in a suitable configuration, e.g., a series configuration, parallel configuration, or combination series-parallel configuration, in an electrical circuit with associated actuator drive components, described in detail below.

The coils 14, 16 are arranged so that a magnetic field-actuated material 18 to be actuated can be positioned within or sufficiently close to the coil configuration to be coupled to a magnetic field generated by the passage of current through the coils. Preferably the coils are arranged with air cores and a common center to the coils, but such is not required. Whatever coil configuration is employed, the coil configuration, and particularly the angular orientation of the wire turns of each of the coils, are selected to cause superposition of the magnetic fields produced by current flow through the coils to produce selectable, discrete magnetic field directions, that enable, e.g., actuation and reset magnetic field orientations.

The actuator further includes an actuator drive circuit 23, which can include a power supply and controlled switch circuit 24 to drive current flow through the coils, and if necessary, can include a directional circuit 26 for enabling control of the direction of current flow through the coils, corresponding to the production of actuation and reset magnetic fields with the single coil configuration. The directional circuit 26 is shown in FIG. 1 as a diode bridge but such is not meant to be limiting; any suitable directional circuit, as described below, can be employed.

An example of the magnetic field superposition enabled by the coil configuration of the invention is depicted in FIG. 2. Referring to FIG. 2A, a generalized circuit having a two-coil configuration is shown, here with the coils connected in series but separated from each other, rather than crossed over in the manner shown in FIG. 1; this un-crossed configuration is shown for clarity only, and is meant to represent the cross-over configuration of FIG. 1. A series circuit is formed of the first coil 14, second coil 16, and a voltage source 25 configured as shown with current flowing through each of the coils in the direction of the arrows. FIG. 2B provides representations of the direction of current flow through the first coil 14 and second coil 16 with "•" and "x" indicating current flow directionality out of the page and into the page, respectively, in the conventional manner. The two coils are shown in FIG. 2B in two levels of shading for clarity and are shown crossed over in the manner of FIG. 1. The un-crossed configuration of FIG. 2A is provided for clarity only, to emphasize the series circuit connections.

Figure 2A:
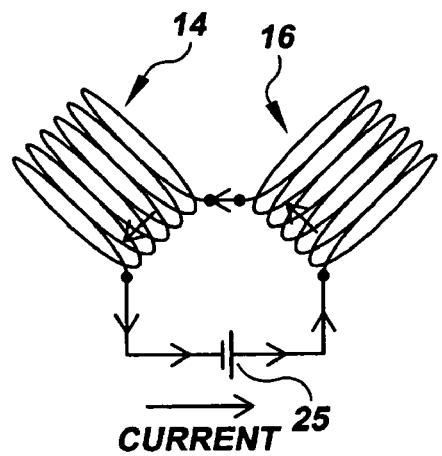
FIG. 2A is a generalized circuit schematic illustrating the principal of operation of the magnetic drive coil configuration of FIG. 1, here with first selected directions of electrical current flow for each of the coils in the configuration.
Figure 2B:
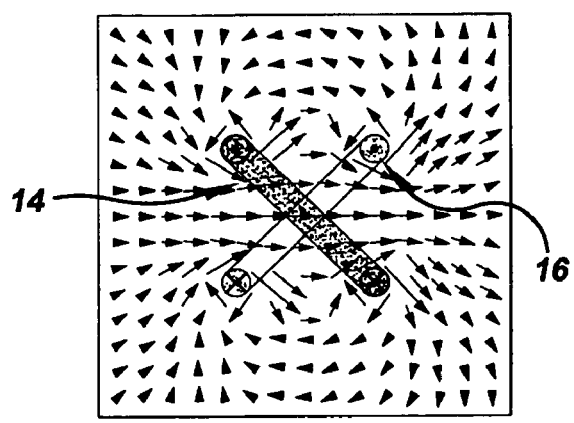
FIG. 2B is a vector profile of the magnetic field generated by the magnetic drive coil configuration and electrical current flow directions of FIG. 2A.

Small arrowheads in FIG. 2B depict the direction and strength of the magnetic field produced by current flow through the two coils. The magnetic field profile shown here corresponds to the crossed-over two-coil configuration of FIG. 1 with the direction of current flow through each coil as-given in FIGS. 2A–2B. As shown in FIG. 2B, this series circuit configuration produces from the first coil 14 a magnetic field oriented from lower left to upper right, and produces from the second coil 16 a magnetic field oriented from upper left to lower right. Superposition of these two magnetic fields therefore results in an overall magnetic field between the two coils that is oriented from left to right.

Figure 2C:
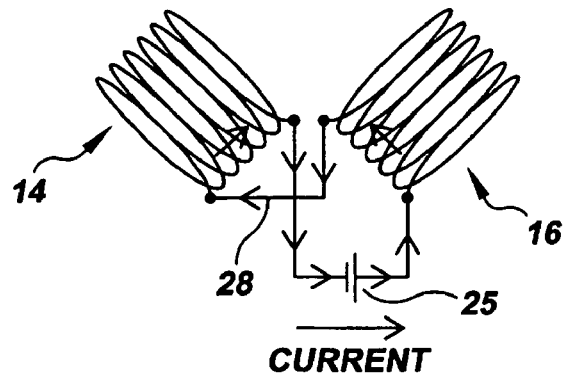
FIG. 2C is a generalized circuit schematic illustrating the principal of operation of the magnetic drive coil configuration of FIG. 1, here with second selected directions of electrical current flow for each of the coils in the configuration.
Figure 2D:
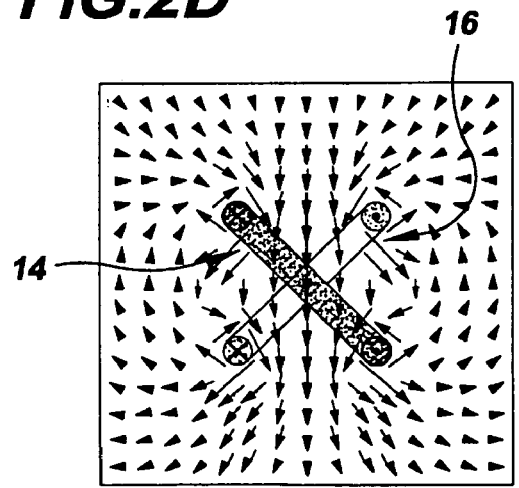
FIG. 2D is a vector profile of the magnetic field generated by the magnetic drive coil configuration and electrical current flow directions of FIG. 2C.

FIG. 2C shows a second generalized circuit, here with the first and second coils 14, 16 configured again in series with a voltage supply 25, but with a connection 28 that reverses the direction of current flow through the first coil 14 while maintaining the original direction of current flow through the second coil 16. FIG. 2D provides representations of this current flow through the first coil 14 and second coil 16 with "•" and "x" indicating current flow directionality out of the page and into the page, respectively, in the conventional manner. As in FIG. 2B, the two coils are here shown in levels of shading for clarity and are shown crossed over in the manner of FIG. 1.

This second series circuit configuration produces from the first coil 14 a magnetic field oriented from upper right to lower left, and produces from the second coil 16 a magnetic field oriented from upper left to lower right. Superposition of these two magnetic fields results in an overall, prevailing magnetic field between the two coils that is oriented from the top to the bottom of the page. The overall magnetic field profile of this second circuit configuration is reoriented from the overall total magnetic field profile of the first configuration by a rotation of substantially 90°.

This reorientation between two magnetic field directions is employed by the invention to enable with a single coil configuration the production of both an actuation magnetic field and a reset magnetic field for an actuation material. By reversal of the direction of current flow through one or more coils in the coil configuration, the overall magnetic field direction is rotated between the two orientations without physically rearranging the coils. This enables a magnetic actuator in which a magnetic material can be fixed in position with respect to a coil arrangement that is also fixed in position, with nothing but redirection of current flow through one or more coils in the coil arrangement required to actuate and then reset the magnetic material with the single coil arrangement.

For many magnetic materials, an angular reorientation between two magnetic field directions, e.g., the 90° shift in direction shown in FIGS. 2B and 2D above, is indeed that shift required for enabling actuation and then resetting of the material. The invention provides this shift between magnetic field directions with an elegantly simple and stable mechanical arrangement that relies on electronic control for producing the actuation and reset magnetic fields and their direction. More specifically, the invention provides a range of configurations for implementing the connection 28 in the generalized circuit of FIG. 2C that enables electronic control for redirection of current flow, as described in detail below.

Figure 3A:
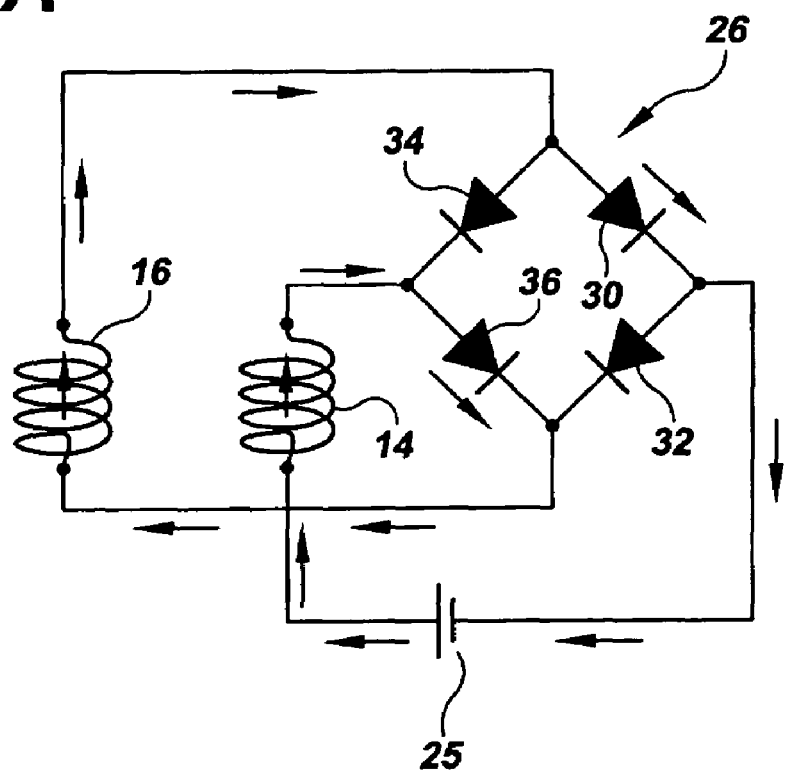
FIG. 3A is a circuit schematic of the coil configuration of FIG. 1 with the power supply of FIG. 1 configured to produce first selected directions of electrical current flow for each of the coils in the configuration.
Figure 3B:
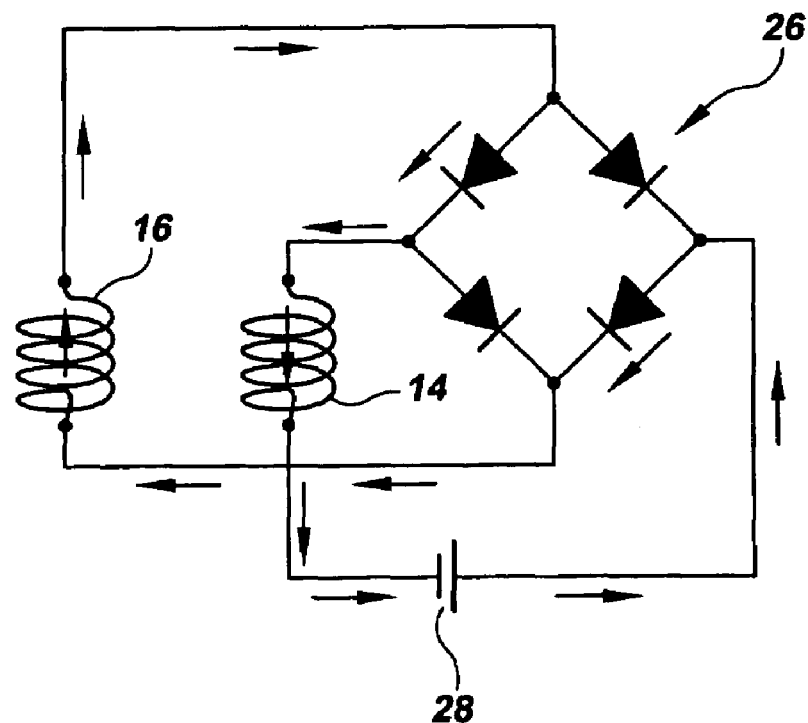
FIG. 3B is a circuit schematic of the coil configuration of FIG. 1 with the power supply of FIG. 1 configured to produce second selected directions of electrical current flow for each of the coils in the configuration.

FIGS. 3A–3B illustrate one example of this electronic control. In FIG. 3A there is schematically shown the two coils 14, 16, represented as uncrossed coils here for clarity. A directionality circuit 26 is provided as a rectifying diode bridge having four diodes 30, 32, 34, 36 in a configuration that enforces a selected one of the two possible current flow directions. The power supply and switch circuit of FIG. 1 is shown here as a voltage source 25 as in FIG. 2A. With the voltage polarity as shown in FIG. 3A, current flows through the diode bridge and the two coils 14, 16 in the direction indicated by the arrows. This corresponds to the configuration shown in FIG. 2B, resulting in a total magnetic field profile from left to right in the page.

Turning to FIG. 3B, with the voltage supply polarity switched 28 from that of FIG. 3A, the diode bridge enforces a current flow in which the direction of current flowing through the second coil 16 remains the same, but the direction of current flowing through the first coil 14 is reversed. This current flow directionality corresponds to the configuration shown in FIG. 2C, resulting in a prevailing magnetic field profile from top to bottom in the page. With this example circuit configuration it is shown that a switch between two selected magnetic field directions is obtained by electronic control of current flow directionality. For a given coil configuration, the magnetic field direction is reoriented by reversing the direction of current flow through at least one selected coil, but not necessarily all coils, in the coil configuration. The direction of current flow through one or more other coils in the configuration can remain the same. The directionality circuit and switching voltage supply polarity produce this reversal of current flow direction through a selected one or more coils while preserving the original direction of current flow through other coils without physically rearranging the coil configuration.

Based on this technique and in accordance with the invention, for a selected magnetic actuation material, a coil configuration is selected that generates an actuation magnetic field with first selected current flow directions through the coils and that generates a reset magnetic field with second selected current flow directions through the coils. As just explained, the direction of current flow can be different for each of the coils and can be either reversed or maintained for causing reorientation of a magnetic field. Each aspect of the coil configuration that contributes to the actuation and reset magnetic fields generation is discussed in turn below. First, the shape of the coils in the configuration can be generally circular, with each generally forming a torus, or can be of other suitable geometry. Each coil in the configuration can be of a distinct shape; all coils need not be of a common shape. The coils' shapes are preferably selected to produce by superposition the desired actuation and reset magnetic fields and to accommodate the geometry of the magnetic material to be arranged within or adjacent to the configuration. The coils' shapes further can be selected to optimize the homogeneity of the generated magnetic fields in the vicinity of the magnetic material.

The turns of wire of the coils in the configuration are selectively angled with respect to other coils to produce desired actuation and reset magnetic fields. In one example, the axes of two identical coils, i.e., the lines that cut perpendicularly through the planes subtended by the coils' toruses or other shapes, are perpendicular or substantially perpendicular to each other, resulting in a reset magnetic field that is perpendicular to an actuation magnetic field and that has the same intensity. It is recognized that the relative orientation of the coils' axes may preferably be adjusted to compensate for various characteristics of the magnetic material, among other features. For example, to compensate for magnetic material demagnetization along one of the actuation or reset field directions, it can be preferred to orient the coil axes at an angle less than or at an angle greater than the perpendicular. Other considerations for coil angle include the presence of restoring forces working against magnetic material actuation or reset and a desire to provide symmetry between actuation and reset conditions for a given level of electrical current. The coil angle is correspondingly adjusted to increase or decrease the magnetic field strength in the actuation or reset directions.

Significant considerations for coil angle and orientation are the size and geometry of a magnetic material to be employed and the direction of magnetic material actuation and magnetic material reset. The magnetic actuator of the invention can include any active magnetic material, i.e., any material that responds to a magnetic field for actuating and/or resetting the material. The coil angle and orientation are preferably selected to accommodate macroscopic material movement due to, e.g., the mechanical stroke and/or force generation, produced by actuation and/or reset of the selected magnetic material with the magnetic material in position at the coil configuration.

Example classes of magnetic materials to be employed in accordance with the invention include ferromagnetic shape memory alloy (FSMA) materials and magnetostrictive materials. It is recognized that the actuation response of single crystal, polycrystalline, and composite materials can differ significantly, but all such material morphologies can be employed. Single crystalline materials, polycrystalline materials, textured polycrystalline materials, i.e., polycrystalline materials for which a large fraction of constituent crystallites have a defined crystallographic orientation, and composites, including an active material and filler material or multiple distinct active materials, can be employed. It is further recognized that a combination of actuation mechanisms can be employed with the coil configuration of the invention as-warranted for a given magnetic material. For example, a combination of magnetic field and heat and/or pressure can be employed to actuate and reset particulates in a composite material. The invention does not inhibit the use of multiple secondary actuation mechanisms.

Considering now a first class of magnetic materials to be employed in accordance with the invention, ferromagnetic shape memory alloy (FSMA) materials can be employed to produce an actuation stroke in response to application of an actuation magnetic field from the actuator coil configuration. The term ferromagnetic shape memory alloy is in common use, but herein is meant generally to refer to ferromagnetic shape memory materials broadly, including alloys, intermetallic compounds, ferromagnetic oxide compounds, and other ferromagnetic materials that are characterized by a shape memory response to a magnetic field; the acronym FSMA is likewise herein meant to refer to this broad class. FSMA materials include, but are not limited to, e.g., alloys which include Ni—Mn—Ga, Ni—Mn—Ga—Co, Fe—Ni—Ga, Ni—Mn—Sb, Cu—Mn—Ga, Ni—Co—Ga, Fe—Ni—Co—Ti, Co—Ni—Al, Co—Ni—Ga, Fe—Pd, and Fe—Pt.

Twinning is the dominant deformation mechanism of FSMA materials when in the martensitic phase. An actuation magnetic field causes magnetization vectors of the twin variants of the martensitic phase to physically turn in alignment with the applied field. Twin variants with magnetic easy axes in a favorable orientation relative to the applied magnetic field grow at the expense of other twin variants. This twin variant rearrangement results, on a macroscopic scale, in a shape change of the FSMA material, leading to an actuation stroke.

To achieve a desired actuation stroke and stroke reset with a single crystalline FSMA material, the material is oriented with respect to the coil configuration of the invention such that the actuation and reset magnetic field directions are both substantially perpendicular to the easy axis of one twin variant and substantially parallel to the easy axis of the other, reciprocal twin variant. With this orientation, the actuation magnetic field will cause one of the twin variants to grow at the expense of the other, depending on which variant's easy axis is more closely aligned with the direction of the applied magnetic field, as explained above. Because the orientation of long and short axes of the crystal structure in each variant differs, the rearrangement of variant volume fractions is accompanied by an actuation strain. The optimum actuation magnetic field orientation with respect to twin variant easy axes is not as well defined when the FSMA is polycrystalline or composite, but in general holds true. Suitable arrangements and orientations of a magnetic field for actuating a FSMA material can be determined as described in U.S. Pat. No 5,958,154, entitled "High-Strain, Magnetic Field-Controlled Actuator Materials, by O'Handley and Ullakko, issued Sep. 28, 1999, the entirety of which is hereby incorporated by reference.

Figure 4:
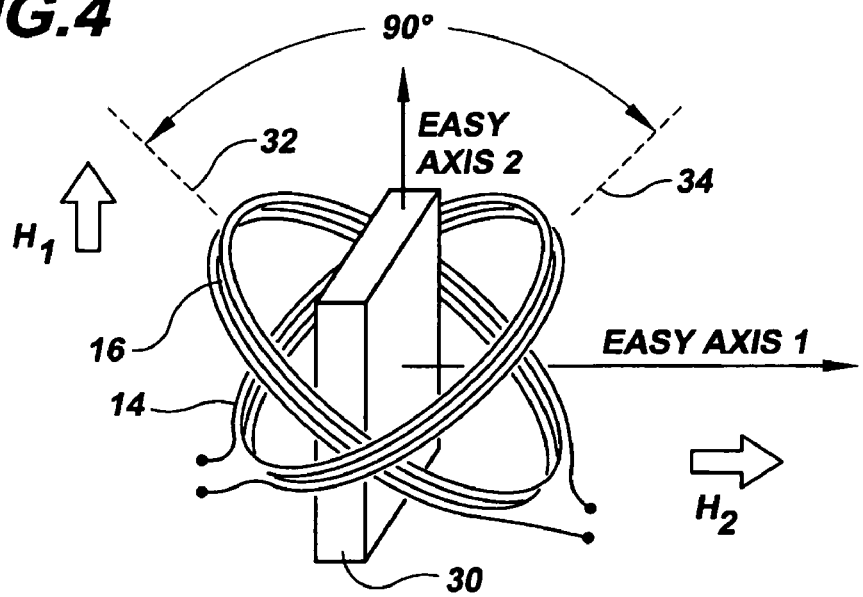
FIG. 4 is a schematic view of a coil configuration of the invention arranged for actuation and reset of a FSMA material.

Referring to FIG. 4, there is shown a schematic view of the coil configuration of FIG. 1, here with specific magnetic field actuation and reset directions defined for a FSMA actuation material 30. In this example, the FSMA actuation material is given as a single crystal alloy, e.g., an Ni—Mn—Ga alloy, cut as a prism with sides parallel to the {001} crystallographic planes of the material. The easy axes of two reciprocal twin variants are defined as shown, Easy-Axis-1 and Easy-Axis-2, which are substantially perpendicular to each other. In accordance with the invention, the FSMA material 30 is oriented with the coil configuration such that a first magnetic field direction, $H_1$, produced by the coil configuration is substantially perpendicular to Easy-Axis-1 and substantially parallel to Easy-Axis-2 and a second magnetic field direction, $H_2$, produced by the coil configuration is substantially perpendicular to Easy-Axis-2 and substantially parallel to Easy-Axis-1. With identical coils arranged as shown in FIG. 4, having an angle of substantially 90° between the coil axes 32, 34, the directions for magnetic fields $H_1$ and $H_2$ are as shown. These magnetic field directions are produced by the flow of current through the coils as described above, with current flowing in the same direction through a first coil for generation of both the $H_1$ field direction and the $H_2$ field direction, and current a second coil reversing direction for the generation of the $H_1$. field direction and the $H_2$ field direction.

With this arrangement, the FSMA material can produce an actuation stroke in response to application of the $H_1$, field and can be reset to reverse the stroke in response to application of the $H_2$ field. The coil configuration thus enables a fully reciprocating actuation motion of the FSMA material. As shown in FIG. 4, it is preferable that the coil configuration be positioned with respect to the magnetic material so as to not hinder this motion during actuation stroke and/or reset. In general this consideration is not limiting in that the coil air core is for most applications larger than the extent of the magnetic material.

With this magnetic FSMA actuation configuration, it is emphasized that FSMA materials are bistable in the sense that all twin variants are characterized by the same crystalline stability, rather than metastable phases. Only in the presence of an applied magnetic field or a mechanical stress does a specific twin variant become unstable to transformations to the reciprocal twin variant and the corresponding mechanical strain development. Thus, once an actuation magnetic field has fully transformed one twin variant into another, the resulting configuration is stable, and the material will not automatically return to its pre-actuation shape, i.e., the developed strain is not automatically reversible.

Thus, as described above, to enable resetting of a FSMA actuation stroke and its developed strain, a reset magnetic field must in general be applied essentially perpendicular to the actuation field direction, i.e., parallel to the direction of the shrunken twin variant. This causes a transformation back to the original twin variant volume fractions and corresponding retraction of actuation stroke. The magnetic actuator of the invention enables reversible, or reciprocal, FSMA actuation with a single coil configuration that produces both an actuation magnetic field and a counterpart reset magnetic field in the desired actuation and resetting directions. This eliminates the need for multiple separate magnetic means for applying transverse actuation and reset magnetic fields, and eliminates the need for a reset bias, e.g., a mechanical bias reset load, against which an actuation magnetic field must work. Because no resetting or actuation bias force need be applied in the actuator of the invention, no energy is lost to overcoming such a force during actuation and reset, and there results an effective increase in the available driving force of the actuator of the invention over that of conventional magnetic actuator configurations.

The class of FSMA materials is especially well-addressed by the magnetic actuator of the invention given that two reciprocal twin variants can in general be defined for field-induced twin boundary motion in FSMA materials. Considering the characteristics of particular FSMA compositions, the alloy Ni—Mn—Ga is the most studied of FSMA materials and the most popular. Single crystal Ni—Mn—Ga alloys, particularly of compositions near the off-stoichiometry point $Ni_{49}Mn_{30}Ga_{21}$, have demonstrated the largest measurable magnetic-field induced strain of the FSMA materials, e.g., about 9.5% strain. In the martensitic phase Ni—Mn—Ga alloys are generally orthorhombic or tetragonal, with a symmetry that is less than cubic, and possess several twin variant unit cell systems. Polycrystalline Ni—Mn—Ga alloy composites can also be employed as actuation materials where material cost is a consideration. It is found that the performance of polycrystalline Ni—Mn—Ga alloys can be increased by texturing the bulk material so as to resemble a single crystal or other oriented structure.

The invention is not limited to Ni—Mn—Ga alloys, and contemplates the use of any suitable FSMA actuation material. For example, as described previously, Fe—Pt and Fe—Pd alloys are also well-suited magnetic actuation materials. These material systems are characterized by an easy plane of magnetization. Theoretically, an actuation strain of about 6% can be produced by these materials. In addition, alloys of Fe—Ni—Ga can be advantageously employed as a magnetic actuation material in that this material system is ferrous.

In accordance with the invention, FSMA materials can be actuated by techniques other than twin variant reorientation and strain. For example, the magnetic actuator of the invention can be employed to cause a phase transformation between the austenitic and martensitic FSMA phases. When the FSMA material is ferromagnetic through its martensitic transformation then the absolute values of the magnetization and magnetocrystalline anisotropy change from the parent, high-temperature austenitic phase to the product, low-temperature martensitic phase. Consequently, in the presence of a magnetic field, the total magnetic energy contribution to the free energy in the parent and product structures can be different. This amounts to a driving force favoring the phase with lower energy. Magnetic actuation can exploit this driving force to produce austenitic-martensitic phase transformations, with the associated development of strain produced by the change in crystallographic structures.

This actuated phase transformation can enable a reciprocating strain development with three distinct levels. From an austenitic state an extended martensitic state can be achieved by a transversal magnetic field in the manner of the magnetic field, $H_2$, of FIG. 4. Likewise a contracted martensitic state can be achieved by a longitudinal magnetic field in the manner of the magnetic field, $H_1$, of FIG. 4, as the direction of the transforming magnetic field also selects the variant that the product phase adopts upon transformation. Magnetic materials that can be employed for actuated phase transformation include, e.g., Ni—Mn—Ga, Fe—Ni—Co—Ti, Fe—Pd, and other suitable alloys that are characterized by a Curie temperature higher than the material's martensitic transformation temperature.

In addition to FSMA materials, magnetostrictive materials can be employed as an active magnetic material in the actuator of the invention. Application of a magnetic field to a magnetostrictive material causes the material to be strained as the domain magnetization vectors of the material rotate out of the magnetic easy axes to align with the direction of the applied magnetic field. The unit cells of the material are strained by this magnetization rotation but their orientation is not changed; this results in actuation. The developed strain is proportional to the square of the cosine of the angle between the material's magnetization and the applied magnetic field. Magnetostrictive materials are particularly useful for their characteristically large blocking stresses, which can be in excess of 160 MPa. While most magnetostrictive-actuator devices can exploit only one of field-induced contraction or field-induced expansion, exclusively, from one magnetic field orientation, the present invention makes possible both magnetostrictive expansion and contraction in directions perpendicular to the field.

Any suitable magnetostrictive material can be employed in accordance with the invention. Alloys of $Fe_2Dy_xTb_{1-x}$ are suitable, and particularly the alloy Terfenol-D®, which is commercially available and is well-suited for the magnetic actuator of the invention. Single crystalline Terfenol-D®, as well as polycrystalline Terfenol-D® and textured polycrystalline Terfenol-D® can be employed. In addition, the magnetostrictors Tb—Fe and Dy—Fe and modifications with Zn, Sm—Fe, Fe—Ga, known as galfenol, and other magnetostrictive materials, including Fe—Pd, Fe—Pd—Co, and Fe—Pd—Ni can also be employed.

For many applications, a FSMA material can be preferred over magnetostrictive materials. FSMA materials can in general be produced in a selected crystalline structure at lower cost and the resulting crystalline material is not as brittle as magnetostrictive materials. More significantly, FSMA materials generally have form factors that are different than those of magnetostrictive materials. Although the specific energy can be higher in FSMA materials than in magnetostrictive materials, the output energy produced by FSMA materials is delivered at large strokes and low forces, while the converse is true for magnetostrictive materials. Hence FSMA materials are in generally found to be particularly well suited for applications requiring large strokes.

Whatever magnetic material is employed, electrical current is controlled to flow through the coil configuration of the invention in a manner that produces the particular actuation needs of a given application. The actuation and reset fields can be generated by a continuous (DC) flow of current through the coil configuration, by an alternating current (AC) flow through the coil configuration, or by pulses of current through the coil configuration. The particular current flow control to be employed is preferably selected based on the characteristics of the actuation material, the actuation output required for a given application, and limitations of the actuator's electronic circuitry.

In general, to produce a magnetic field of sufficient strength for actuating or resetting a magnetic material, a trade-off must be made between electrical current density and number of wire turns in the coil configuration. A desired magnetic field strength can be achieved either with a relatively high electrical current flowing through a low number of wire turns in each coil of the configuration, or with a relatively lower electrical current flowing through a large number of wire turns in each coil of the configuration. For example, for many applications, the required duration of DC current flow through the coil wires precludes the use of high current density, which could damage the wires, and instead requires coils having many wire turns and conduction of only modest current levels. Similarly, AC current flow through the coil wires generally requires conduction of no more than modest current levels through coils having many wire turns.

It is found that coil configurations having many wire turns are characterized by a significant electrical coil inductance. This coil inductance limits the frequency at which actuation and reset magnetic fields can be produced and correspondingly limits the frequency at which actuation and reset of a magnetic material can be achieved. Compensation for the coil inductance in an effort to increase actuation frequency requires a larger power supply and attendant volume and weight increases. Therefore, in accordance with the invention, DC and AC magnetic field generation techniques are best suited for applications not requiring high actuation frequencies. For low frequency applications, a coil configuration including many wire turns can be employed with low current levels, preserving the mechanical integrity of the actuator while obtaining sufficient actuation and reset magnetic field strength.

In accordance with the invention the use of pulsed current flow through the coil configuration overcomes the actuation speed limitations of DC and AC magnetic field generation and can be preferred for many applications. Pulsed magnetic field generation can be accomplished by a short-duration, high-current pulse through the coil configuration. Due to the short duration of the pulse, a high level of current can be sustained without damage to the coil wires. As a result, a high current level can be exploited to reduce the number of wire turns required to achieve a desired magnetic field strength. Correspondingly, the reduced number of wire turns reduces the inductance of the coils in the coil configuration. This reduced inductance enables fast magnetic field generation and fast magnetic material actuation and reset. The reduced number of wire turns also enables an actuator that is more compact and less costly than that of large-wire-turn DC and AC actuators. Therefore, in accordance with the invention, for applications in which actuation speed, actuator production cost, and actuator bulk are of concern, pulsed magnetic field generation can be preferred.

Figure 5:
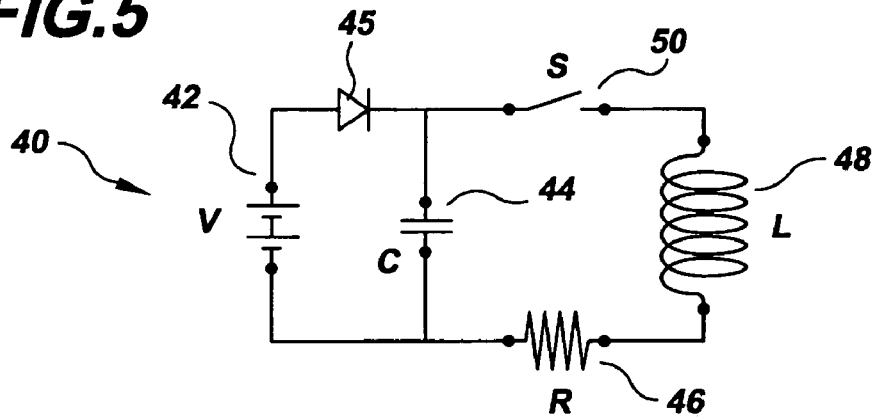
FIG. 5 is a generalized circuit schematic representing the circuit elements provided by one actuator drive circuit of the invention.

Referring to FIG. 5 there is shown a generalized actuator drive circuit 40 schematically representing example circuit elements that can be included for enabling pulsed magnetic field generation with the magnetic actuator of the invention. The circuit includes a voltage supply 42 connected in parallel with a capacitor, C, 44 and in series with a switch or diode 45 oriented as shown. A resistive element, R, 46 and an inductive element, L, 48 are connected in series with the capacitor and a switch, S, 50, forming an oscillating LCR circuit. In operation, the power supply is controlled to charge up the capacitor to a selected voltage and then the switch is closed to discharge the capacitor into the series inductance and resistance load, resulting in pulsed magnetic field generation as the current oscillates through the LCR circuit.

In the magnetic actuator of the invention, the power supply and capacitor elements can be selected and suitably configured in connection with the coil configuration. The series resistance element of the LCR circuit is the sum of the resistance of the wire turns in the coil configuration, the resistance of the directional circuit, e.g., the diode bridge shown in FIG. 1, and the resistance of other connecting wires in the circuit. The inductance element of the LCR circuit is the series inductance of the coils in the coil configuration in combination with stray inductances of the circuit components and wires. Depending on the combination of a selected capacitor or capacitors, the wire resistance, and the inductance, the current pulse generated by the circuit will result in either over-damped or under-damped circuit behavior.

Figure 6A:
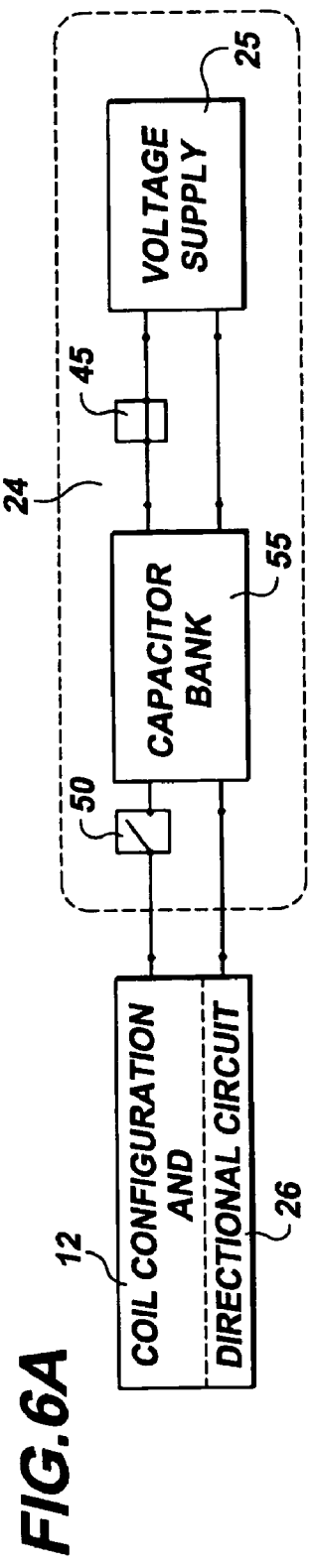
FIGS. 6A–6C are block diagrams showing the states of switches employed to generate a magnetic field pulse in accordance with the invention.
Figure 6B:
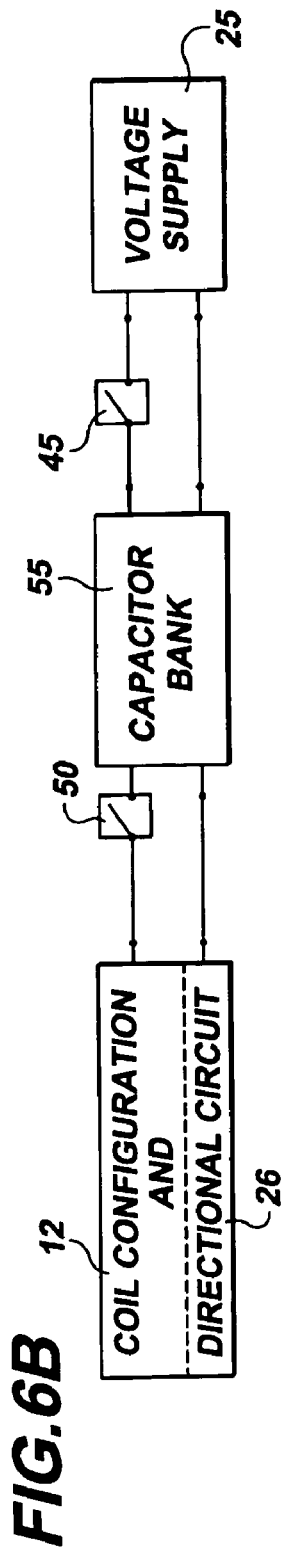
Figure 6C:
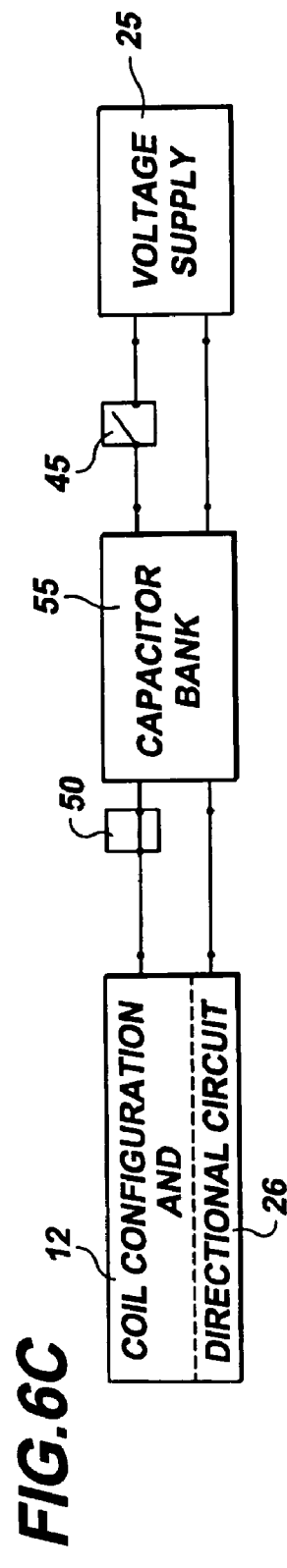

FIGS. 6A–6C present the various pulse generation switch settings for the magnetic actuator of the invention. As shown in FIG. 6A, the coil configuration 12 and directional circuit 26 of FIG. 1 are connected to the power supply and controlled switch 24. The power supply and controlled switch are in this example implemented as a voltage supply 25 and capacitor or capacitor bank 55 as-necessary for a given application. In a first pulse generating step, shown in FIG. 6A, a first switch 45, located in series between the capacitor 55 and the voltage supply 25, is closed and a second switch 50, located in series between the coil configuration/directional circuit and the capacitor 55, is open. In this configuration, the capacitor bank can be charged up to a selected voltage level.

Once the capacitor is sufficiently charged, then as shown in FIG. 6B, the first switch 45 is opened. Finally, as shown in FIG. 6C, the second switch 50 is then closed. This switch closure forms the series LCR circuit of FIG. 5 and discharges the charge of the capacitor into the circuit. The resulting current flows through the directional circuit and coil configuration, with the swing in current producing a corresponding magnetic pulse at the location of the coil configuration. The current pulse and magnetic field pulse automatically extinguish themselves due to resistive, inductive, and actuation losses.

Figure 7:
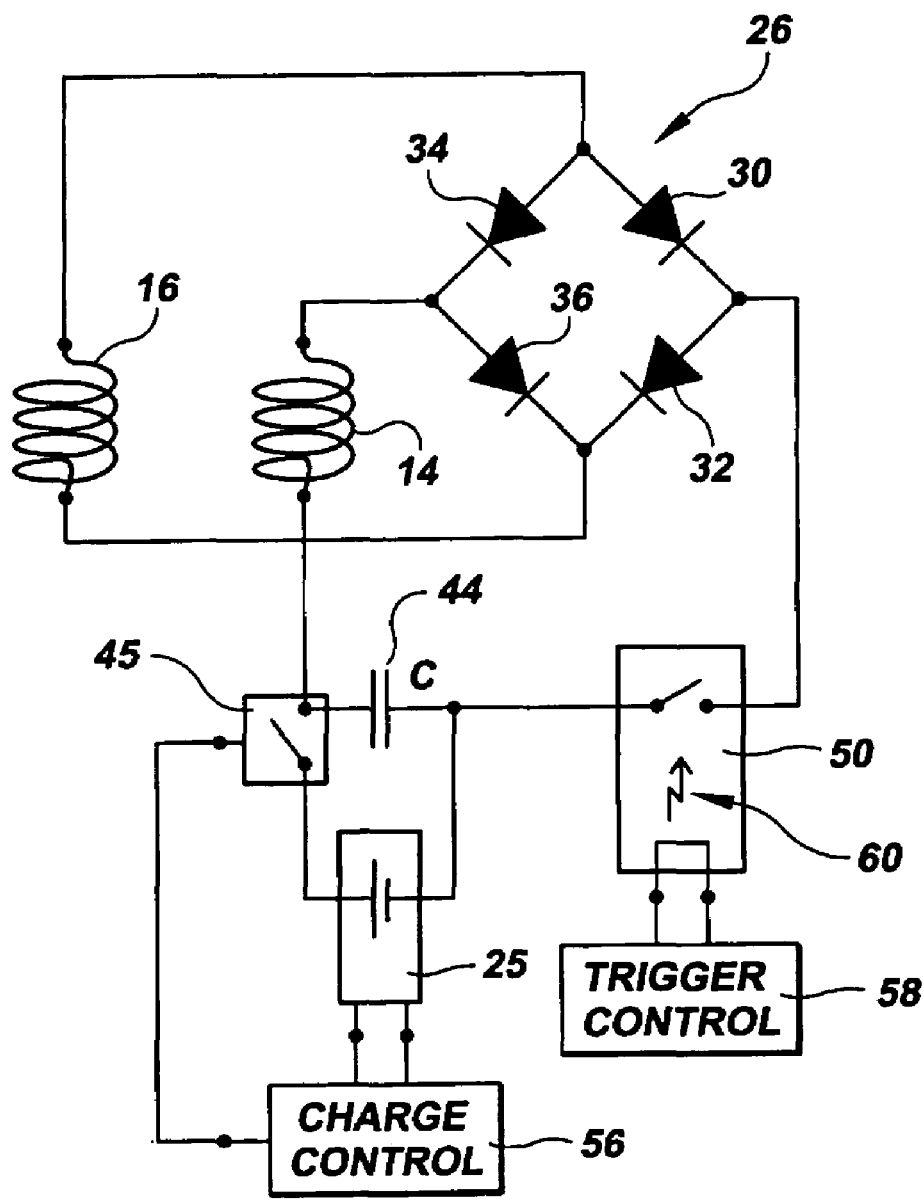
FIG. 7 is an example circuit implementation of the magnetic actuator drive circuit of the invention for actuation and reset of a magnetic material.

FIG. 7 shows one example implementation for this magnetic pulse drive circuit configuration. Here the coil configuration is represented as in FIGS. 3A–B as two coils 14, 16, shown again physically separated for clarity. A charge controller 56 is provided to control the state of the first switch 45 connected between the power supply 25 and capacitor 44. In one example, the power supply is provided as a high-voltage power supply, e.g., a Bertan Series 105 voltage supply from Spellman High Voltage of Hauppauge, N.Y. The capacitor can be provided as, e.g., a plurality of capacitors in a capacitor bank connected to produce a desired total capacitance value. With the first switch 45 closed and the second switch 50 open, the power supply charges up the capacitor to a preselected voltage controlled by the charge controller 56. The polarity of the preselected voltage is set by the charge controller to actuate or reset the magnetic material based on, e.g., user-input parameters for the current cycle of material actuation and reset. In other words, the capacitor is charged with a positive or negative voltage polarity corresponding to a desired material actuation or reset at a given point in time during an actuation cycle.

With the capacitor charging complete, the charge controller opens the first switch 45, and a trigger controller 58 closes the second switch 50. With this switch control, the capacitor is connected with the directional circuit and the coil configuration as a series LCR circuit to generate a magnetic field pulse in the vicinity of the coil configuration. The trigger switch 50 preferably is a fast-acting switch, e.g., an IGBT switch, a plurality of MOSFET transistors, or a thyristor, i.e. a silicon controlled rectifier.

The charge controller 56 and trigger controller 58 can be provided as, e.g., a programmed computer connected to the pulse generation circuit, or can be provided as customized hardware in an ASIC or other integrated hardware configuration to be hardwired into the circuit. In either scenario, it can be preferred to enable user programmability of the actuation control, e.g., to provide step-wise actuation and/or reset in the manner described below. The two controllers can be implemented as a single master control module or as separate modules. The trigger circuits and magnetic drive circuit can for some applications preferably be electrically isolated from the control electronics by means of optical couplers 60 with the second switch 50 to enable high speed and high precision in the initiation of pulse generation.

It is recognized in accordance with the invention that for some applications, it can be preferred to substitute a controlled current supply for the capacitor charging and LCR circuit connections described above. The invention is not limited to the capacitive pulse generation circuit just described. Alternatively, there can be employed a controlled current supply that is operated to produce positive or negative current pulses as-required for magnetic material actuation or reset. Such a controlled current supply has the advantage of eliminating the need for separate capacitors as well as multiple switches and controllers.

Whether a capacitor discharge technique or a controlled current supply is employed for generating a current pulse in the coil configuration of the invention, the characteristics of the resulting magnetic field pulse are dependent on the parameters of the coil configuration. The number of wire turns for each coil, the wire gauge, the lead length, and the coil radius all effect the pulse characteristics and are to be selected accordingly. Such is accomplished preferably based on the magnetic field requirements for a given application. First, the actuation and reset magnetic field pulses to be generated by the coil configuration must provide a peak magnetic field and corresponding magnetic force that is sufficient for the mode of actuation of a given magnetic material. For example, the peak magnetic field must be sufficient to provide FSMA material twin boundaries with adequate driving force to enable movement of the boundaries. The magnetic pulse duration and the time to reach the peak field strength must correspond to the actuation frequency desired for a given application. The peak current must not exceed that which would damage the circuit componentry, and the onset current-increase rate must be smaller than the slew rate of the slowest component in the circuit. Modeling of the magnetic field produced as a function of current and coil geometry enables specification of an optimized coil configuration. A commercial modeling system, such as FEMLAB, from iMath, of Singapore, that includes electromagnetic modeling capability, can be suitable employed for this task.

In one example embodiment, the coils in the coil configuration are provided with copper wire turns of a selected gauge. It can be preferred to provide a non-magnetic, non-conductive support for the wire turns, to eliminate the possibility of coupling between the support and the coils and to eliminate induced currents in the support material. Delrin®, having a light weight and good stiffness, is a particularly good support material, but fiber-glass epoxies and other such materials can be employed as suitable. Because relatively high currents can be generated by current pulses through the coil configuration, loose wires can deform or break over time. It therefore can be preferred to cover the wire turns with an epoxy or other material once the coils are mounted in a selected angular orientation with the support material.

Figure 8:
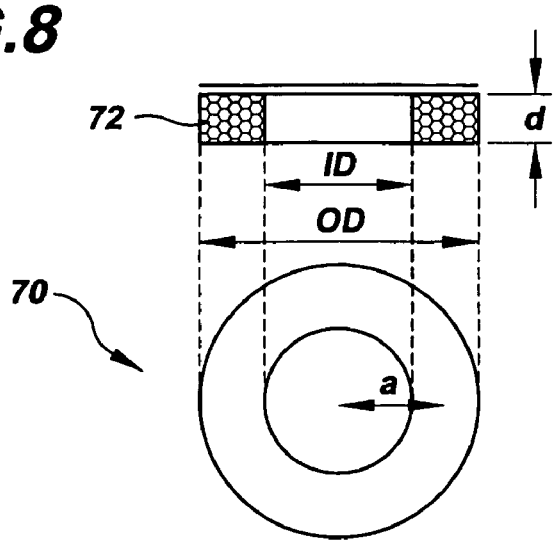
FIG. 8 shows schematic cross-sectional and planar views of a wire coil employed in conjunction with another coil of similar characteristics to generate a magnetic field in accordance with the invention.

FIG. 8 depicts various parameters of a circular wire coil 70 that are to be selected for producing a desired magnetic field pulse. This wire coil is designed to be employed in a two-coil configuration like that shown in FIG. 1 and FIG. 4. The coil is formed of a number, n, of turns of wire 72 shown in cross section in the upper portion of FIG. 8. The wires are individually insulated and of a selected gauge, W. The circular coil is characterized by a radius, a, an inner diameter, ID, and outer diameter, OD, as shown in the planar view in the lower portion of FIG. 8. The coil winding is defined with a thickness, d.

Table I below provides three example coil designs based on these parameters, and identifies the resulting magnetic field characteristics for selected capacitance values, C, and peak voltage values, $V_0$ from a drive circuit. For each of the three examples, the charging and trigger control of the drive circuit of FIG. 7 is employed, with a diode bridge including fast recovery diodes, such as series 5SDF diodes available from ABB, Inc., of Norwalk, Conn. A trigger switch that is a bidirectional control thyristor, e.g., a series 5STB available from ABB Inc., of Norwalk, Conn. is also employed for all examples, and it is assumed in all cases that the lead resistance is less than about 0.5 Ohm.

TABLE I

| Parameter | Example 1 | Example 2 | Example 3 |
| --- | --- | --- | --- |
| Radius a | 0.25 cm | 2.0 cm | 2.86 cm |
| Thickness d | 0.16 mm | 0.55 mm | 0.55 mm |
| Gauge W | 40 (0.1 mm diameter) | 24 (0.6 mm diameter) | 16 (1.3 mm diameter) |
| Outer Diameter OD | 0.61 cm | 4.3 cm | 6.4 cm |
| Inner Diameter ID | 0.39 cm | 3.69 cm | 5 cm |
| Number Turns n | 30 | 25 | 25 |
| Capacitor charging voltage $V_0$ | 200 V | 400 V | 500 V |
| Capacitance | 1 µF | 40 µF | 240 µF |
| Peak Magnetic Field | 1 T | 0.75 T | 1.32 T |
| Rise time to Peak Field | 4 µs | 140 µs | 200 µs |
| Peak Current | 30 A | 170 A | 430 A |
| Current surge Peak Rate | 20 A/µs | 5 A/µs | 5 A/µs |

These example coil and circuit parameters demonstrate that with a relatively small number of coil wire turns, a significant magnetic pulse can be generated. Notably, only commercially available components are needed to produce this dramatic performance and reasonable circuit element values can be employed. It is to be recognized that the componentry and component values employed are preferably selected based on the specific requirements of a given application. For example, the actuation stroke extent required for a given application dictates the magnetic material geometry and size, and correspondingly the coil geometry. Larger materials require higher magnetic fields and consequently higher currents, more robust coil wires, high-current diodes, larger capacitors, and perhaps particular capacitors, such as electrolytic capacitors. Smaller magnetic actuation materials can be adequately actuated with smaller current levels, employing conventional diodes and other componentry, and for many applications, a commercial programmable current pulse supply. Thus, the performance characteristics of the actuation application as well as componentry, e.g., the diode response time and activation voltage, switch activation voltage, and other component parameters are to be considered in selecting a particular actuator circuit implementation.

Of particular importance for selection of circuit implementation are the properties of the magnetic material to be actuated. Several material properties directly impact the ability to effectively actuate the material. For example, while a substantially constant magnetic field is not shielded by an electrical conductor, time-varying magnetic fields produced by either pulsed or AC current flow can generate eddy currents in the material, thereby modifying the intended magnetic field. The conductivity of the magnetic material therefore cannot be neglected in designing the coil configuration and the magnetic field to be generated by the configuration. An exact description of the magnetic field produced internal to a magnetic material requires consideration of the material's dimensions and corresponding non-linear susceptibility. It is preferred that modeling of the material dimensions, conductivity, and susceptibility be conducted to determine appropriate actuation and reset magnetic fields and the corresponding coil and circuit designs. The mechanical inertia of the material and the time-dependent material characteristics of the material, such as twin boundary pinning in FSMA materials, are also preferably modeled.

The skin depth, $\delta_{skin}$, of the material at a given frequency is a quantity that can be used to estimate the maximum field rise rate inside the magnetic material, and thus the limit of operation frequency of the actuator. Skin depth is given as:

$$\delta_{skin} = \frac{1}{\sqrt{\pi v \mu \sigma}}; \qquad (1)$$

where $v$ is the frequency of an electromagnetic wave incident on the material, µ is the material permeability, and σ is the material conductivity. For estimation purposes, the maximum frequency of actuation for a given electromagnetic attenuation condition, $v_{max}^{att}$, likewise can be expressed as:

$$v_{max}^{att} = (\pi \mu \sigma d^2)^{-1}; \qquad (2)$$

for a sample thickness d. For example, given a Ni—Mn—Ga alloy material having a thickness of 1 mm, the maximum actuation frequency is of the order of 50 kHz.

Now considering the impact of material properties on the required magnetic driving force, for a Ni—Mn—Ga alloy at a maximum applied driving force, which is equal to the magnetocrystalline anisotropy, $K_u$, mechanical inertia limits the extension response time of the material. With this consideration and that given above, an estimate for the maximum actuation frequency, $v_{max}^m$, can thus be expressed as:

$$v_{max}^m = \sqrt{\frac{K_u}{8\epsilon_{tw}^2 L^2 \rho}}; \qquad (3)$$

where $\epsilon_{tw}$ is the twinning strain, L is the actuation material length, and r is the material mass density. For a Ni—Mn—Ga actuation alloy, this expression indicates an actuation frequency on the order 2.5 kHz for a crystal of 1 cm in length.

For more detailed results, particularly when the actuation frequencies that need to be achieved are near the maximum frequencies given by the maximum achievable frequency for a particular electromagnetic attenuation condition, $v_{max}^{att}$, modeling of the field evolution inside the crystal can be preferred. One dimensional analytic results in the absence of twin boundary motion can be made but numerical approaches can in general better account for all sample dimensions. Likewise, it can be preferred to model inertial effects if the desired actuation frequency is close to the estimate of the maximum attainable frequency for a given inertial condition, $v_{max}^m$. An example of such a modes, taking into account twin boundary position, is given in "Pulsed Magnetic Field-Induced Twin Boundary Motion on Ni—Mn—Ga," by Marioni, MIT Ph.D. Thesis, May 2003.

It is recognized in accordance with the invention that both pulsed and AC-current generated magnetic fields can be employed to incrementally actuate and/or reset a magnetic material in the magnetic actuator of the invention. Step-wise actuation and/or reset can be accomplished by control of the magnetic pulse duration and/or maximum field intensity or by control of the AC duty cycle characteristics and maximum field intensity. A range of control flexibility is enabled by these scenarios; for example, a single pulse of a selected intensity or a selected number of pulses of a fixed, prespecified intensity can be selected to achieve a desired step or steps in an actuation or reset phase of magnetic material control.

Referring to FIG. 9A there are shown the steps in a first example control technique 80 for step-wise actuation of a magnetic material. This example control technique is based on actuation of a magnetic material, such as an FSMA material, for producing an actuation stroke having a prescribed output displacement. This example is provided for discussion purposes and is not limiting; other magnetic materials and other actuator output characteristics, such as output force, can similarly be step-wise controlled. In this example, magnetic field pulses are applied for actuating and resetting a magnetic material, with the peak, i.e., maximum, magnetic field generated by each pulse preselected and fixed. The number of magnetic field pulses is instead varied for achieving desired actuation or reset of the magnetic material.

After the start 82 of an actuation or reset control cycle, a target actuator displacement, for actuation or reset, is input 84 to the actuator controller and the actual, current displacement of the magnetic material is acquired 86. Such displacement measurement can be carried out with conventional displacement, motion, or position sensors. The target displacement is then compared with the actual, current displacement 88. If the target displacement is greater than the current displacement, then the number of magnetic field pulses, of the preselected peak field, required to move to the target displacement, is determined 92. The resulting pulse train is then fired 94 for delivery to the coil configuration, by operating the actuator drive circuit as described previously, and the actuation or reset cycle is ended 96.

If the comparison of target displacement with the actual, current displacement 90 determines that the target displacement is less than the current displacement, then it is indicated that the actuator has overshot the desired stroke extension or reset and must be retracted. In this case, the number of magnetic field pulses, of the preselected peak field and having a polarity reversed from that for the current actuation or reset phase, that is required to move to the target displacement, is determined 98. The resulting pulse train is then fired 94 by operating the actuator drive circuit as described previously, and the actuation or reset cycle is ended 96.

If the comparison of target displacement with the actual, current displacement 88, 90 determines that the target displacement is substantially equal to the actual, current displacement, then no additional magnetic field pulses are required and the next control loop cycle can begin 82

Figure 10:
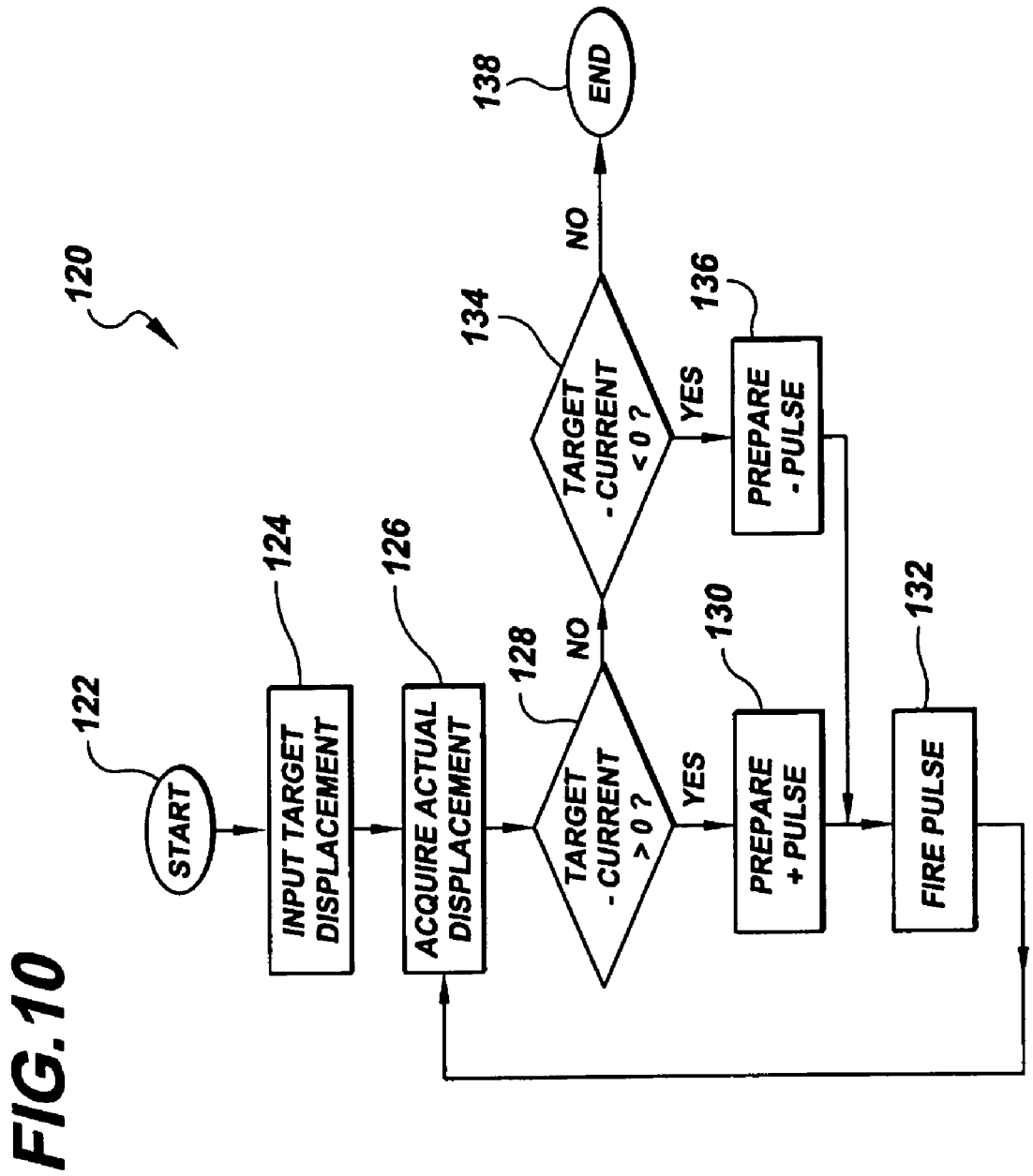
FIG. 10 is a flow chart of the steps in a first technique of the invention for step-wise closed-loop control of pulsed magnetic actuation and reset of a magnetic material.

This control technique can likewise be applied to a scenario in which a single pulse, rather than a train of pulses, is employed to adjust step-wise control of the magnetic material. FIG. 9B shows the steps of such a technique 100. In this case, one pulse is employed to adjust and control magnetic actuation or reset, with the peak magnetic field of that pulse adjusted to achieve the desired adjustment. As shown in FIG. 10, after the start of a control cycle, a target actuator displacement, for actuation or reset, is input 104 to the actuator controller and the actual, current displacement of the magnetic material is acquired 106. Such displacement measurement can be carried out with conventional displacement, motion, or position sensors. The target displacement is then compared with the actual, current displacement 108. If the target displacement is greater than the current displacement, then the peak magnetic field of a single magnetic field pulse for achieving the target displacement is determined 110. The prescribed pulse is then fired 112 by operating the actuator drive circuit as described previously, and the actuation or reset cycle is ended 114.

If the comparison of target displacement with the actual, current displacement 116 determines that the target displacement is less than the current displacement, then it is indicated that the actuator has overshot the desired stroke extension or reset and must be retracted. In this case, the peak magnetic field of a single magnetic field pulse, having a polarity reversed from that for the current actuation or reset phase, for achieving the target displacement is determined 118. The resulting pulse is then fired 112 by operating the actuator drive circuit as described previously, and the actuation or reset cycle is ended 114.

If the comparison of target displacement with the actual, current displacement 108, 116 determines that the target displacement is substantially equal to the actual, current displacement, then no additional magnetic field pulse is required and the next control loop cycle can begin 102.

The scenarios for controlling pulse number and peak pulse magnetic field in the techniques of FIGS. 9A and 9B are open-loop in that once a number of pulses or the peak field of a single pulse are determined, the resulting pulse or pulses are generated without further monitoring of the resulting magnetic material state. In accordance with the invention, these control techniques can instead be conducted in a closed-loop fashion such that precise monitoring of the magnetic material state is carried out for the prescribed control.

FIG. 10 shows the steps of an example closed-loop control technique provided by the invention. After the start 122 of a control cycle, a target actuator displacement, for actuation or reset, is input 124 to the actuator controller and the actual, current displacement of the magnetic material is acquired 126. Such displacement measurement can be carried out with conventional displacement, motion, or position sensors. The target displacement is then compared with the actual, current displacement 128. If the target displacement is greater than the current displacement, then an appropriate pulse or selected number of pulses, of selected peak magnetic field for achieving the target displacement is determined 130. The prescribed pulse or pulses are then fired 132 by operating the actuator drive circuit as described previously.

If the comparison of target displacement with the actual, current displacement 134 determines that the target displacement is less than the current displacement, then it is indicated that the actuator has overshot the desired stroke extension or reset and must be retracted. In this case, the appropriate pulse or selected number of pulses, of selected peak magnetic field and polarity for achieving the target displacement is determined 136. The resulting pulse or pulses are then fired 136 by operating the actuator drive circuit as described previously.

After the firing of the prescribed pulse or pulses, the actual, current actuator displacement is again acquired 126. Thereafter, a comparison is made of the target displacement with the measured displacement to determine if the desired target displacement has been achieved by the prescribed pulse or pulses. If not, then an additional pulse or pulses are prescribed and generated in the manner just described. If the comparison of target displacement with the actual, current displacement 128, 134 determines that the target displacement is substantially equal to the actual, current displacement, then no additional magnetic field pulse or pulses are required and the actuation or reset is complete.

These control techniques provided by the invention enable precise step-wise control of magnetic material response and resetting of the magnetic material conditions. The determination of prescribed peak magnetic field and/or number of magnetic field pulses to achieve a target actuation is made based on the magnetic material geometry and properties, as described above, and on the operational parameters of the circuit. Once a selected magnetic material is well-characterized in its response to a magnetic field, then a calibrated correspondence between material response and peak field and/or number of pulses can be employed for the control techniques.

For example, considering the magnetic material Ni—Mn—Ga, with a magnetic field applied perpendicularly to the easy axis of one twin variant and parallel to that of another, a magnetic driving force, $\Delta G$, is generated causing the growth of the latter twin variant at the expense of the former. This driving force can also be understood as a magnetic pressure $\sigma_{mag} = \Delta G/\epsilon_{tw}$. It can be shown that $\Delta G = K_u(2\eta - \eta^2)$, where $\eta = M_s H/2K_u$ is a measure of the magnetic field and takes on values from 0 to 1; here $M_s$ is the saturation magnetization. The relation between crystal extension and applied driving force can depend on the Ni—Mn—Ga crystal quality, and its geometry, and is preferably determined as part of a calibration procedure for the crystal. The relation is typically, but not necessarily, linear between a threshold driving force and corresponding driving field, and the maximum driving force $-K_u$, the effective or saturation field, $2K_u/M_s$. Thus incremental extension, $\Delta x = m(\Delta G - \Delta G_{th})$ for $\Delta G$ between 0 and $-K_u$, with m being a constant specific to the crystal and $\Delta G_{th}$ being the minimum threshold driving force that can produce actuation. Given a target $\Delta x$, $\Delta G$ is determined by solving the above equation. The required magnetic field strength to be applied follows from the expression for $\Delta G$. The resulting magnetic field strength corresponds to a value for the required current peak, and thus for the voltage to be applied. Particularly for closed-loop control-configurations, the use of pulses with the maximum possible driving force $-K_u$ and a short duration can be preferred. In this case the duration of the driving field would preferably be chosen to be a fraction of the time $\frac{1}{2} v_{max}^m$.

Turning now to various applications of the magnetic actuator of the invention, in a first application, the actuator can be employed for controlling fluid flow, e.g., in a valve configuration as shown in FIGS. 11A–11B. In this application the actuator having a drive coil configuration 12, shown schematically configured with a magnetic material 18, enables control of an obstruction such as a shutter 150 to the flow of fluid through a channel 152. For example, the shutter 150 can be moved in and out of the channel 152 in a motion perpendicular or inclined to the flow direction as the actuator is driven and reset with corresponding magnetic field directions, $H_1$, and $H_2$, respectively, as shown in the figures. The shutter thus reduces the cross section of the channel as the shutter is moved into the channel, creating a resistance to fluid flow, effectively reducing the flow, and eventually stopping the flow altogether.

In an alternative valve configuration shown in FIGS. 12A–12B, the magnetic actuator is configured, shown schematically with a two-coil arrangement 12 and a magnetic material 18, to shift a lever 154 attached to an axle 156, rotating the axle. The axle transmits the rotational motion to a flap 158 inside a channel 152 conducting a fluid. As the flap rotates, its cross sectional area blocking the channel changes, causing a corresponding change in resistance to flow.

The actuator of the invention can further be employed in a compact positioner, shown schematically in FIG. 13. In this application the magnetic material 18 is connected to a stage 160 for which motion is to be controlled. With this arrangement, the stage motion is a direct transmission of the actuator linear extension or contraction. This arrangement can be configured with a single actuator 12 or with an array of actuators such as the two actuators shown, for example to effect an output force increase of the ensemble over that of a single actuator, or preferably to apply varying amounts of force on different points of a positioner stage.

The magnetic actuator of the invention can further be configured for tilt and displacement of a platform as shown in FIGS. 14A–14D. Such tilting and displacement can be carried out separately or simultaneously, e.g., for positioning of optic components. Here two actuators 12 are configured, with one on each leg 162, 164 of a platform base 165. In one example, as the actuators are magnetically driven, as shown in FIG. 14A, one leg 164 extends while the other leg 162 contracts. The shafts 166, 168 transduce this extension and retraction into tilt of a platform 169. In a further example, shown in FIG. 14B, the extension and retraction of platform legs shown in FIG. 14A is reversed, causing a correspondingly reversed tilt. Displacement of the platform can be carried out as shown in FIG. 14C by actuating both actuators with a common magnetic field direction that causes leg extension and platform rise, or as shown in FIG. 14D, with a common magnetic field direction that causes leg contraction and platform decent. A further stage positioner arrangement is shown in FIGS. 15A–15B. Here a column 175 is provided within the coil arrangement 12 to serve as a fixed support. The magnetic material serves as a moving support. This arrangement provides a compact stage 180 that can tilt. When the magnetic material 18 is actuated to produce an extension stroke, as in FIG. 15B, tilting of a stage occurs.

This tilting stage element, and the cooperative dual-actuator arrangement of FIGS. 14A–D, can be extended to the arrangement of FIG. 16, wherein a number of base structures 170a–170d, and so on, can be linked to produce a desired movement based on cumulative tilt and displacement at each base. A string of such segments can be controlled to take up different geometries, and are useful to position optics through cavities that are difficult to access otherwise. In the same way that these arrangements can function as positioners, they can also act as active vibration dampeners, inasmuch as they can be driven to cancel out existing vibration modes of a connected structure.

Figure 18A:
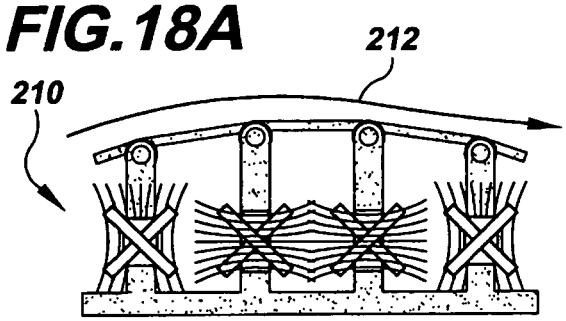
FIGS. 18A–18B are schematic views of an array of wing flap positioners like that of FIGS. 17A–B, here showing first and second wing profiles, respectively.
Figure 18B:
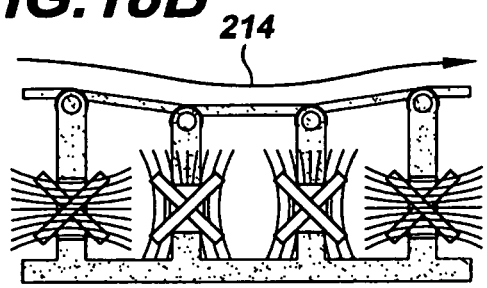
Figure 17A:
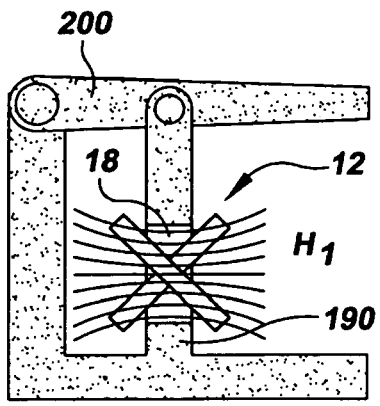
FIGS. 17A–B are schematic views of the magnetic actuator of the invention configured as a wing flap position controller, showing first and second wing flap positions, respectively.
Figure 17B:
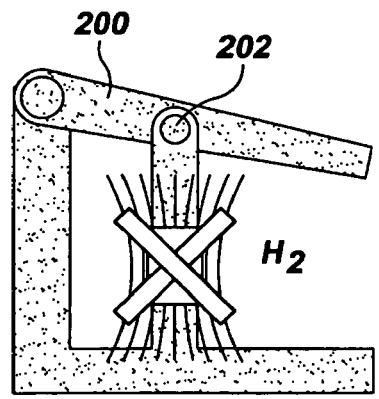

The actuator of the invention further can be employed in variable airfoil applications, where the cross sectional profile of a wing or aerodynamic surface is to be modified, e.g., according to a prescription for reduction in turbulence, to provide more effective lift, or to reduce drag. An example of such a wing flap control is shown in FIGS. 17A–17B. The actuator coils 12 and magnetic material 18 are configured on one side of a lever 190 connected to a wing flap 200. In one example control scenario, as the lever is caused to contract, as shown in FIG. 17B, an axle 202 transduces this contraction into a corresponding movement of the flap 200. As shown in FIGS. 18A–18B, an array of actuators 210 can be provided on control legs and coordinated to change the profile of a wing with high precision to contour the flow profile between e.g., a first profile 212 shown in FIG. 18A and a second profile shown in FIG. 18B.

Figure 19A:
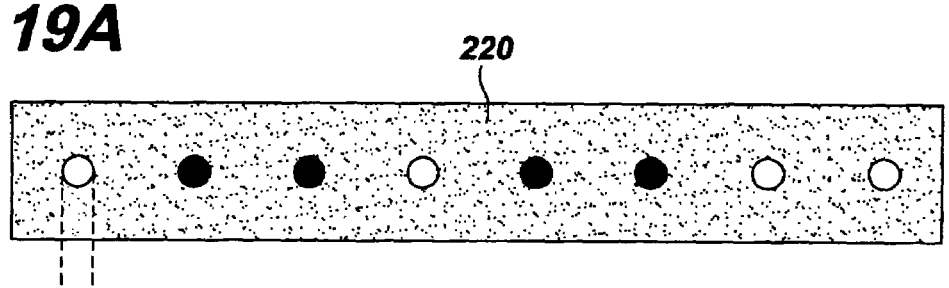
FIGS. 19A–B are schematic views of an array of magnetic actuators of the invention configured as Braille display elements.
Figure 19B:
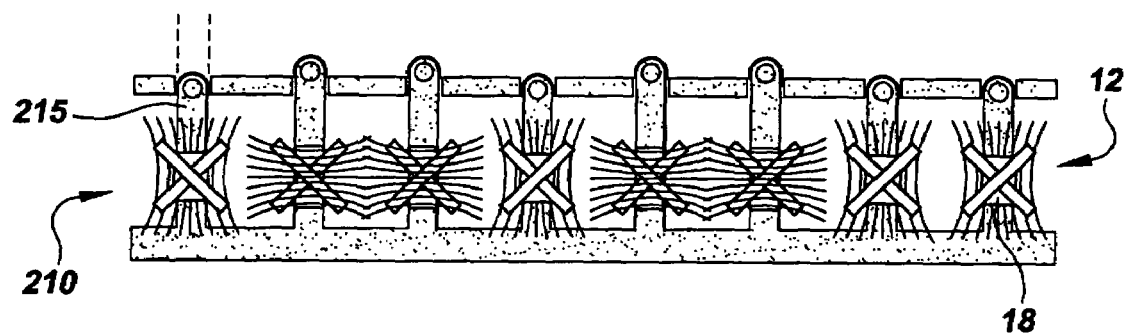

Referring to FIGS. 19A–19B, an array of actuators 210 can be employed on pins 215 that form a Braille display 220. FIG. 19A provides a view of the pin correlations for the pin height arrangement in FIG. 19B. As an actuator coil arrangement 12 is controlled to actuate a magnetic material 18, a pin is raised or lowered, enabling production of a controlled Braille position. This example application particularly demonstrates advantages of the magnetic actuator of the invention. Due to the large strain values achieved by magnetic active materials such as FSMA materials, the actuator is particularly well suited for very compact applications, where the space for mechanical amplification devices is unavailable.

The magnetic actuator of the invention and its active, reciprocal actuation and reset techniques overcome the many limitations of conventional passive, stress-induced reset and passive magnetic reset techniques. The active magnetic resetting technique, in combination with the pulsed-field actuation technique of the invention, enables a small, light-weight, and compact magnetic actuator, requiring only a comparatively small power source. These characteristics greatly expand the range of applications of magnetic material actuation. For example, wherever the low blocking force that is characteristic of Ni—Mn—Ga actuation material is a limitation, an array of actuators can be employed in a dense packing configuration, if desired.

The relatively low weight of the magnetic actuator of the invention enables application to many configurations, particularly air-borne applications, as well as, e.g., valves and vibration dampeners, for which weight is a crucial operational aspect. The magnetic actuator of the invention can be miniaturized with ease, enabling application to, e.g., micropositioners and medical applications such as catheterized devices. Other applications include fast valves, as a replacement for solenoid valves; as well as clamps, e.g., for use in a rocket payload release application; as push rods, e.g., for use in Braille displays, as high frequency displacement transducers, e.g., for sonar, micropositioners, or other application; and for adaptive structures in general, e.g., variable air-foil technologies.

It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

I claim:

1. A magnetic actuator comprising:
   a magnetic field-actuated material;
   a plurality of interconnected electrically conducting coils, each coil including a number of wire turns arranged relative to at least one other coil to produce at the magnetic field-actuated material, by superposition, a magnetic field that is substantially oriented in one of a plurality of selectable discrete directions; and
   an actuator drive circuit connected to the coils in a circuit configuration that reverses a direction of electrical current flow through at least one of the coils to reorient the magnetic field from a first selected direction to a second selected direction of the plurality of selectable discrete directions.

2. The actuator of claim 1 wherein the magnetic field-actuated material comprises a block of material.

3. The actuator of claim 1 wherein the magnetic field-actuated material comprises a single crystal material.

4. The actuator of claim 1 wherein the magnetic field-actuated material comprises a polycrystalline material.

5. The actuator of claim 4 wherein the magnetic field-actuated material comprises a textured polycrystalline material.

6. The actuator of claim 1 wherein the magnetic field-actuated material comprises a composite material.

7. The actuator of claim 1 wherein the magnetic field-actuated material comprises a ferromagnetic shape memory material.

8. The actuator of claim 7 wherein the magnetic field-actuated material comprises a ferromagnetic shape memory alloy.

9. The actuator of claim 7 wherein the ferromagnetic shape memory material comprises an alloy including Ni, Mn, and Ga.

10. The actuator of claim 9 wherein the ferromagnetic shape memory alloy further includes Co.

11. The actuator of claim 7 wherein the ferromagnetic shape memory material comprises an alloy including Fe and Pt.

12. The actuator of claim 7 wherein the ferromagnetic shape memory material comprises an alloy including Fe and Pd.

13. The actuator of claim 7 wherein the ferromagnetic shape memory material comprises an alloy including Fe, Ni, and Ga.

14. The actuator of claim 7 wherein the ferromagnetic shape memory material comprises an alloy including Co, Ni, and Al.

15. The actuator of claim 7 wherein the ferromagnetic shape memory material comprises an alloy including Co, Ni, and Ga.

16. The actuator of claim 7 wherein the ferromagnetic shape memory material comprises an intermetallic compound.

17. The actuator of claim 7 wherein the coils are arranged to produce the plurality of selectable discrete magnetic field directions including a first direction for actuation of the ferromagnetic shape memory material and a second direction for reset of the ferromagnetic shape memory material for subsequent actuation.

18. The actuator of claim 17 wherein actuation of the ferromagnetic shape memory material comprises extension of an actuation stroke and reset of the ferromagnetic shape memory material comprises retraction of the actuation stroke.

19. The actuator of claim 17 wherein the first magnetic field direction is substantially perpendicular to an easy magnetic axis of a first twin variant of the ferromagnetic shape memory material and substantially parallel to an easy magnetic axis of a second twin variant, and the second magnetic field direction is substantially parallel to the easy magnetic axis of the first twin variant of the ferromagnetic shape memory material and substantially perpendicular to the easy magnetic axis of the second twin variant.

20. The actuator of claim 19 wherein the ferromagnetic shape memory material is disposed at a center point of the coils.

21. The actuator of claim 1 wherein the magnetic field-actuated material comprises a magnetostrictive material.

22. The actuator of claim 21 wherein the magnetostrictive material comprises an alloy of $Fe_2Dy_xTb_{1-x}$.

23. The actuator of claim 21 wherein the magnetostrictive material comprises an alloy including Tb and Fe.

24. The actuator of claim 21 wherein the magnetostrictive material comprises an alloy including Dy and Fe.

25. The actuator of claim 21 wherein the magnetostrictive material comprises an alloy including Pd and Fe.

26. The actuator of claim 25 wherein the magnetostrictive alloy further includes Co.

27. The actuator of claim 25 wherein the magnetostrictive alloy further includes Ni.

28. The actuator of claim 21 wherein the coils are arranged to produce the plurality of selectable discrete magnetic field directions including first and second directions perpendicular to each other, the first direction corresponding to development of tensile magnetostrictive strain and the second direction corresponding to development of compressive magnetostrictive strain along a direction of stroke in the magnetostrictive material.

29. The actuator of claim 28 wherein the first magnetic field direction corresponds to a development of maximum tensile magnetostrictive strain and the second direction corresponds to a development of maximum compressive magnetostrictive strain along a direction of stroke in the magnetostrictive material.

30. The actuator of claim 1 wherein the coils include an air core.

31. The actuator of claim 1 wherein the magnetic field-actuated material is disposed within an air core of at least one of the coils.

32. The actuator of claim 1 wherein the plurality of coils are arranged with a common center point.

33. The actuator of claim 1 wherein the plurality of coils are electrically connected in series.

34. The actuator of claim 1 wherein the plurality of coils are arranged relative to each other in a circuit configuration that produces a substantially perpendicular reorientation of the magnetic field direction when the direction of current flow is reversed through one of the coils.

35. The actuator of claim 1 wherein the plurality of coils comprises two coils.

36. The actuator of claim 35 wherein the two coils are characterized by a common number of turns and a common wire gauge.

37. The actuator of claim 35 wherein the two coils are characterized by air cores and are arranged with a common center point.

38. The actuator of claim 35 wherein the two coils are arranged with an axis of the first coil substantially perpendicular to an axis of the second coil.

39. The actuator of claim 1 wherein the actuator drive circuit includes a directionality circuit in an electrical connection with the coils that enforces a selected and independent direction of current flow through at least one of the coils.

40. The actuator of claim 39 wherein the directionality circuit comprises a diode bridge.

41. The actuator of claim 40 wherein the diode bridge is configured with first and second coils in a connection with the coils that accommodates a reversal in direction of current flow through the first coil independent of the second coil.

42. The actuator of claim 1 wherein the actuator drive circuit includes a power supply.

43. The actuator of claim 42 wherein the power supply comprises a voltage supply.

44. The actuator of claim 42 wherein the power supply comprises a controlled current supply.

45. The actuator of claim 42 wherein the actuator drive circuit includes a charge controller connected to set voltage polarity of the power supply in correspondence with reversal of electrical current flow direction through at least one of the coils to reorient the magnetic field from a first selected direction to a second selected direction.

46. The actuator of claim 45 wherein the actuator drive circuit includes a capacitor connected to deliver a pulse of electrical current to the coils.

47. The actuator of claim 46 wherein the capacitor is connected to the power supply and the charge controller by a charging switch for charging the capacitor to a selected voltage polarity and magnitude.

48. The actuator of claim 46 wherein the actuator drive circuit includes a trigger switch connected to the capacitor and connected in series with the coils to deliver the pulse of current to the coils.

49. The actuator of claim 48 wherein the actuator drive circuit includes a trigger controller connected to control the trigger switch for delivery of the pulse of current to the coils after the capacitor is charged.

50. The actuator of claim 1 wherein the first selected magnetic field direction corresponds, along one given direction, to extension of the magnetic field-actuated material and the second selected magnetic field direction corresponds to retraction of the magnetic field-actuated material.

51. The actuator of claim 50 wherein the magnetic field-actuated material is connected to an output positioning element that is controlled by extension and retraction of the magnetic field-actuated material.

52. The actuator of claim 50 wherein the magnetic field-actuated material is connected as a Braille display element one position of which is controlled by extension and retraction of the magnetic field-actuated material.

53. The actuator of claim 1 wherein the magnetic field-actuated material is connected to a wing flap and the plurality of selectable discrete directions of magnetic field orientation correspond to movement of the wing flap toward discrete limit positions.

54. The actuator of claim 1 wherein the magnetic field-actuated material is connected to a platform and the plurality of selectable discrete directions of magnetic field orientation correspond to movement of the platform toward discrete limit positions.

55. The actuator of claim 1 wherein the magnetic field-actuated material is disposed relative to a flow of fluid in a valve configuration having an open valve condition and a closed valve condition, with valve states between the open and closed valve conditions being attained by appropriate application of a magnetic field along selected magnetic field directions.

56. A method for controlling a magnetic field-actuated material comprising:
providing an electrical current flow to a plurality of interconnected electrically conducting coils, each coil including a number of wire turns arranged relative to at least one other coil to produce, by superposition, at the magnetic field-actuated material, a magnetic field that is substantially oriented in one of a plurality of selectable discrete directions; and
reversing a direction of electrical current flow through at least one of the coils to reorient the magnetic field from a first selected direction to a second selected direction of the plurality of selectable discrete directions.

57. The method of claim 56 wherein the first selected magnetic field direction actuates the magnetic field-actuated material and the second selected magnetic field direction resets the material for subsequent actuation.

58. The method of claim 56 wherein the first selected magnetic field direction produces extension of an actuation stroke of the magnetic field-actuated material and the second selected magnetic field direction causes retraction of the actuation stroke.

59. The method of claim 56 wherein the electrical current flow comprises a DC current flow.

60. The method of claim 56 wherein the electrical current flow comprises an AC current flow.

61. The method of claim 56 wherein the electrical current flow comprises a pulsed current flow.

62. The method of claim 61 wherein the electrical current flow comprises a pulsed current flow produced by capacitor discharge.

63. The method of claim 61 wherein the electrical current flow comprises a train of current pulses of a prespecified maximum current magnitude.

64. The method of claim 61 further comprising:
measuring an extension of an actuation stroke of the magnetic field-actuated material produced by the first selected magnetic field direction;
comparing the measured extension with a prespecified target extension;
determining a number of current flow pulses of a prespecified maximum current flow magnitude required to attain the prespecified target extension; and
providing the determined number of current flow pulses to the coils.

65. The method of claim 61 further comprising:
measuring an extension of an actuation stroke of the magnetic field-actuated material produced by the first selected magnetic field direction;
comparing the measured extension with a prespecified target extension;
determining a maximum current magnitude of a single current flow pulse required to attain the prespecified target extension; and
providing a current flow pulse of the determined maximum current magnitude to the coils.

* * * * *